(12) United States Patent
Kim et al.

(10) Patent No.: US 9,111,960 B2
(45) Date of Patent: Aug. 18, 2015

(54) SEMICONDUCTOR DEVICES WITH VERTICAL CHANNEL TRANSISTORS

(75) Inventors: Hui-Jung Kim, Seongnam-si (KR); Yongchul Oh, Suwon-si (KR); Daeik Kim, Hwaseong-si (KR); Hyun-Woo Chung, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 935 days.

(21) Appl. No.: 13/242,660

(22) Filed: Sep. 23, 2011

(65) Prior Publication Data

US 2012/0153379 A1    Jun. 21, 2012

(30) Foreign Application Priority Data

Dec. 17, 2010  (KR) .................. 10-2010-0130057

(51) Int. Cl.
*H01L 29/78* (2006.01)
*H01L 29/66* (2006.01)
*H01L 27/108* (2006.01)

(52) U.S. Cl.
CPC .... *H01L 29/66666* (2013.01); *H01L 27/10876* (2013.01); *H01L 29/7827* (2013.01)

(58) Field of Classification Search
CPC ............ H01L 29/7813; H01L 29/7802; H01L 29/7827; H01L 29/0696; H01L 29/66666
USPC ...................... 257/329, 5; 365/148
See application file for complete search history.

(56) References Cited

U.S. PATENT DOCUMENTS

| | | | |
|---|---|---|---|
| 5,656,842 A | 8/1997 | Iwamatsu et al. | |
| 7,105,894 B2 * | 9/2006 | Yeo et al. | 257/347 |
| 7,564,084 B2 | 7/2009 | Song et al. | |
| 2001/0045589 A1 * | 11/2001 | Takeda et al. | 257/297 |
| 2002/0121662 A1 * | 9/2002 | Rosner et al. | 257/329 |
| 2004/0007734 A1 * | 1/2004 | Kato et al. | 257/324 |
| 2007/0051994 A1 * | 3/2007 | Song et al. | 257/296 |
| 2008/0205118 A1 * | 8/2008 | Gruening-von Schwerin et al. | 365/148 |
| 2008/0225588 A1 | 9/2008 | Jin et al. | |
| 2010/0240205 A1 * | 9/2010 | Son et al. | 438/588 |

FOREIGN PATENT DOCUMENTS

| | | |
|---|---|---|
| JP | 09008290 | 1/1997 |
| KR | 10-0673012 B1 | 1/2007 |
| KR | 102008008388 | 9/2008 |

* cited by examiner

*Primary Examiner* — Matthew Landau
*Assistant Examiner* — Eric Ashbahian
(74) *Attorney, Agent, or Firm* — Harness, Dickey & Pierce, P.L.C.

(57) ABSTRACT

Semiconductor devices with vertical channel transistors, the devices including semiconductor patterns disposed on a substrate, first gate patterns disposed between the semiconductor patterns on the substrate, a second gate pattern spaced apart from the first gate patterns by the semiconductor patterns, and conductive lines crossing the first gate patterns. The second gate pattern includes a first portion extending parallel to the first gate patterns and a second portion extending parallel to the conductive lines.

20 Claims, 30 Drawing Sheets

SEMICONDUCTOR DEVICES WITH VERTICAL CHANNEL TRANSISTORS

CROSS-REFERENCE TO RELATED APPLICATION

This application claims priority under 35 U.S.C. §119 to Korean Patent Application No. 10-2010-0130057, filed on Dec. 17, 2010, in the Korean Intellectual Property Office (KIPO), the entire contents of which is incorporated herein by reference.

BACKGROUND

1. Field

Example embodiments of the inventive concepts relate to semiconductor devices, and more particularly, to semiconductor memory devices with vertical channel transistors.

2. Description of the Related Art

A vertical channel transistor has a source electrode and a drain electrode respectively disposed at an upper side and a lower side of a channel region. A two-dimensional metal oxide semiconductor field effect transistor (MOSFET) has a source electrode and a drain electrode respectively disposed at both sides of a channel region

SUMMARY

Example embodiments of the inventive concepts may provide semiconductor devices capable of preventing and/or reducing a floating body phenomenon of a vertical channel transistor. Other example embodiments of the inventive concepts may provide semiconductor devices capable of suppressing and/or reducing crosstalk between bit lines.

According to example embodiments of the inventive concepts, a semiconductor device may include a plurality of semiconductor patterns on a substrate, a plurality of first gate patterns between the semiconductor patterns, a plurality of conductive lines crossing the first gate patterns; and a second gate pattern spaced apart from the first gate patterns by the semiconductor patterns, the second gate pattern including at least one first portion extending in parallel to the first gate patterns and at least one second portion extending in parallel to the conductive lines.

According to some example embodiments, the device may include a second gate insulating layer between the first portion and the semiconductor pattern and between the second portion and the conductive line. According to other example embodiments, the semiconductor pattern may include a first doped region formed in a lower portion of the semiconductor pattern, a second doped region formed in an upper portion of the semiconductor pattern, and a channel region between the first and second doped regions. The first and second doped regions may have a different conductivity type from the substrate.

According to still other example embodiments, a bottom surface of the first portion may be located at a lower level than a top surface of the first doped region. According to even other example embodiments, the first doped region may be penetrated by the first portion. According to yet other example embodiments, the first portion may be configured to face sidewalls of a plurality of the semiconductor patterns in common. According to further example embodiments, the first portion may include an extended portion extending downwardly toward the substrate to cover a sidewall of the second portion. According to still further example embodiments, the device may include a first gate insulating layer between the first gate patterns and the semiconductor patterns.

According to even further example embodiments, the device may include memory elements connected to upper portions of the semiconductor patterns, respectively. According to yet still further example embodiments, in a running direction of the conductive line, the first portion may be disposed between the semiconductor patterns constituting a nearest pair and the first gate patterns may be disposed between the semiconductor patterns constituting a next nearest pair. According to yet even further example embodiments, the first gate patterns may be spaced apart from each other between the semiconductor patterns constituting the next nearest pair. According to still yet other example embodiments, a bottom surface of the first portion may be located at a lower level than a bottom surface of the first gate pattern.

According to yet still further example embodiments, the second gate pattern may be electrically isolated from the conductive lines. According to yet further example embodiments, in a running direction of the first gate pattern, the second gate pattern may include a plurality of the second portions disposed between the semiconductor patterns constituting a nearest pair and between the semiconductor patterns constituting a next nearest pair, and the conductive lines may be disposed between the semiconductor patterns constituting the next nearest pair.

According to even yet further example embodiments, the conductive lines may be spaced apart from each other between the semiconductor patterns constituting the next nearest pair. Moreover, in a space between the semiconductor patterns constituting the next nearest pair, the second portion may be between the conductive lines. According to still yet further example embodiments, the device may further include a lower insulating layer between the second portion and the substrate and between the conductive lines and the substrate. According to still yet further example embodiments, the semiconductor patterns may be electrically isolated from the substrate by the lower insulating layer.

According to yet even still further example embodiments, the semiconductor patterns may be disposed on each of the conductive lines, and the device may include a metal silicide layer between the semiconductor patterns and the conductive line. According to yet further embodiments, a bottom surface of the second portion may be located at a lower level than a bottom surface of the conductive line. According to yet further embodiments, a top surface of the second gate pattern may be located at a lower level than a top surface of the first gate pattern.

According to at least one example embodiment, a vertical channel semiconductor device may include a plurality of active layers each including a channel between a source and a drain, a first gate extending across a first side of the plurality of active layers between the sources and drains, a second gate extending across second and third sides of the plurality of active layers, the second gate asymmetric to the channels and overlapping a single end of each of the channels on the second side, and a plurality of conductive lines extending in a direction parallel to the third side, the conductive lines separated by the second gate.

BRIEF DESCRIPTION OF THE DRAWINGS

Example embodiments will be more clearly understood from the following brief description taken in conjunction with the accompanying drawings.

FIGS. 1-3 are perspective diagrams illustrating semiconductor devices according to example embodiments of the inventive concepts;

FIGS. 4 and 5 are sectional diagrams illustrating some aspects of vertical channel transistors according to example embodiments of the inventive concepts;

FIGS. 6-23 are perspective or sectional diagrams illustrating methods of fabricating semiconductor devices according to example embodiments of the inventive concepts;

FIG. 24 is a perspective diagram illustrating semiconductor devices according to other example embodiments of the inventive concepts;

FIGS. 25-30 are perspective diagrams illustrating methods of fabricating semiconductor devices according to other example embodiments of the inventive concepts;

FIG. 31 is a schematic block diagram illustrating electronic devices including semiconductor memory devices according to example embodiments of the inventive concepts; and FIG. 32 is a schematic block diagram illustrating memory systems including semiconductor memory devices according to example embodiments of the inventive concepts.

Figure 1:
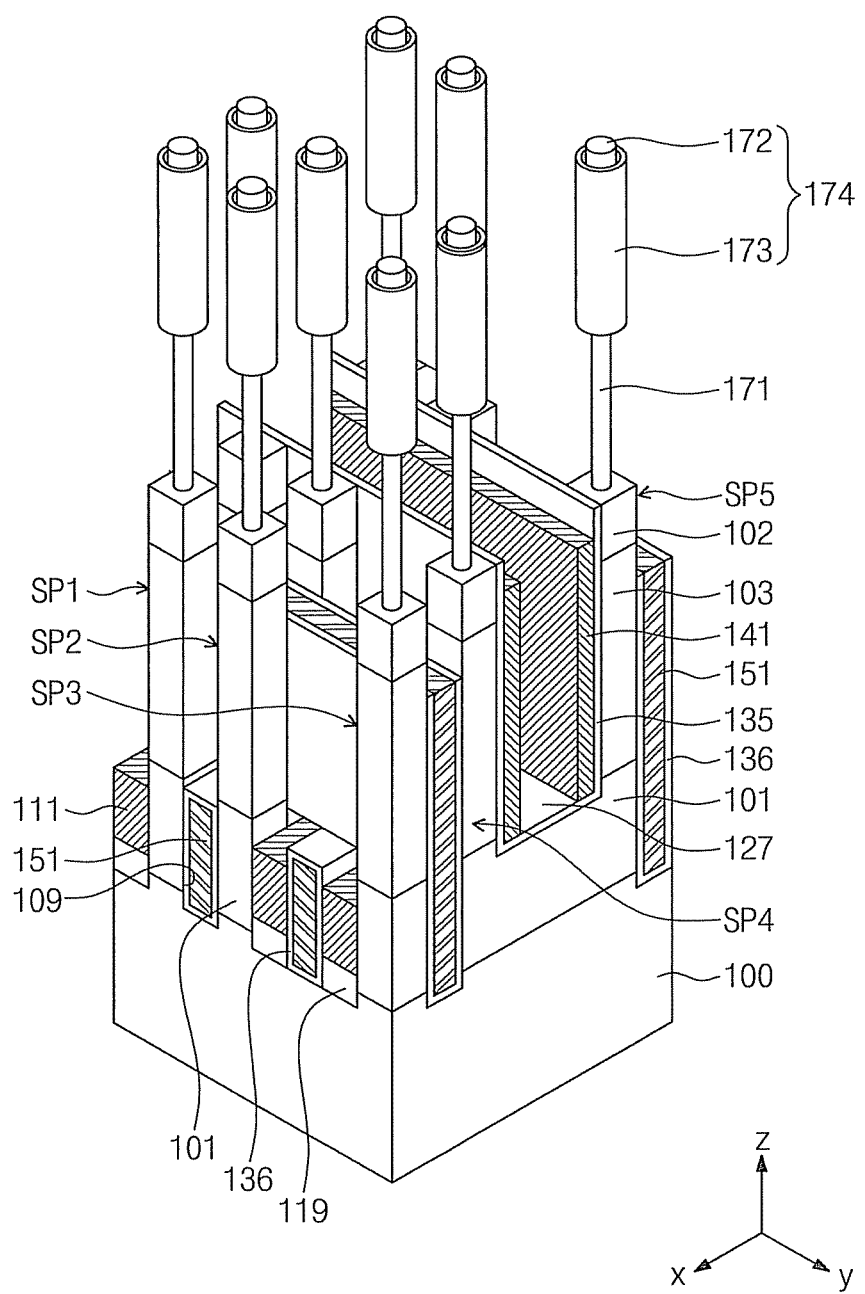
FIGS. 1-32 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiments, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "includes", "including", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
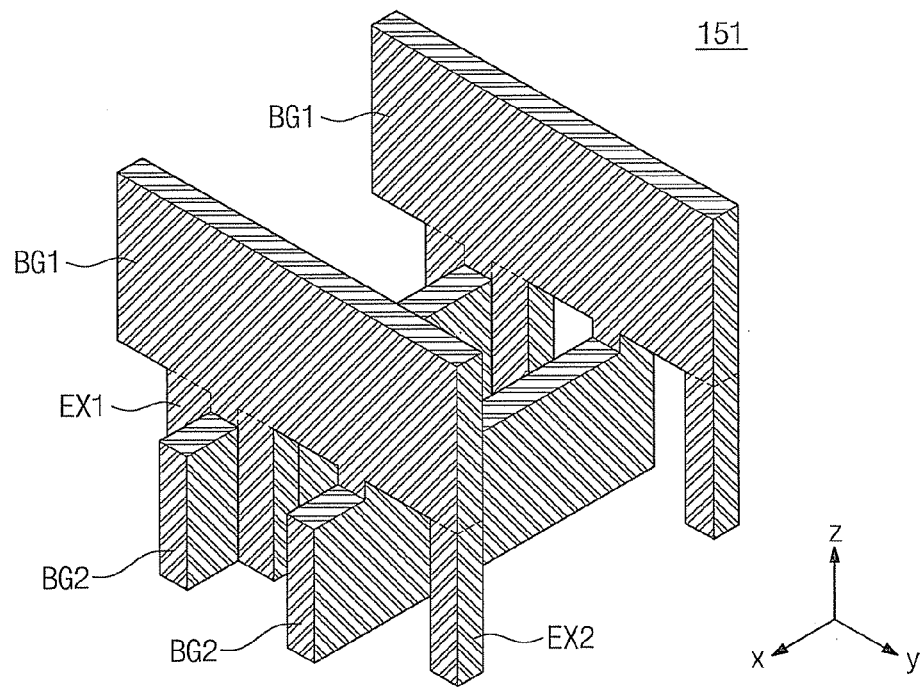
Figure 3:
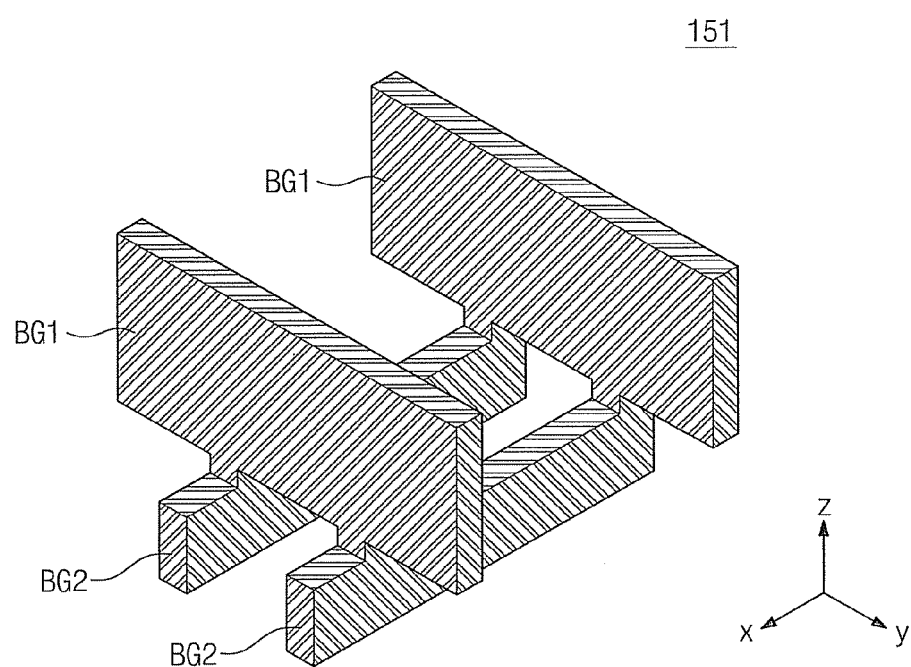

FIGS. 1-3 are perspective diagrams illustrating semiconductor devices according to example embodiments of the inventive concepts. FIG. 2 may illustrate a second gate pattern according to some example embodiments of the inventive concepts, and FIG. 3 may show a second gate pattern according to other example embodiments of the inventive concepts. In order to reduce complexity in the drawings and to provide better understanding of example embodiments of the inventive concepts, some elements of semiconductor devices may be omitted in the FIGS. 1-3. Those of ordinary skill in the art with knowledge of example embodiments will understand which elements may be omitted from both the accompanying drawings and descriptions of fabricating methods.

Referring to FIGS. 1-3, a substrate 100 may be provided. The substrate 100 may be, for example, a silicon substrate, a germanium substrate, and/or a silicon-on-insulator (SOI) substrate. The substrate 100 may be, for example, a semiconductor layer (e.g., an epitaxial layer). A plurality of semiconductor patterns SP may be provided on the substrate 100. For example, the semiconductor patterns SP may include at least first, second, third, fourth, and fifth semiconductor patterns SP1, SP2, SP3, SP4, and SP5. The semiconductor patterns SP may be two-dimensionally arranged on a top surface of the substrate 100. According to example embodiments, the first to third semiconductor patterns SP1-SP3 may be arranged along a y-direction, and the third to fifth semiconductor patterns SP3-SP5 may be arranged along an x-direction.

Not all distances between the semiconductor patterns SP may be equal to each other. For example, a y-directional distance between the second and third semiconductor patterns SP2 and SP3 may be greater than that between the first and second semiconductor patterns SP1 and SP2, and an x-directional distance between the fourth and fifth semiconductor patterns SP4 and SP5 may be greater than that between the third and fourth semiconductor patterns SP3 and SP4. To facilitate understanding of example embodiments of the inventive concepts, teems "nearest pair" and "next nearest pair" will be used hereinafter. The term "nearest pair" may refer to a pair of relatively adjacent semiconductor patterns, for example, the first and second semiconductor patterns SP1 and SP2 or the third and fourth semiconductor patterns SP3 and SP4, and the term "next nearest pair" may refer to a pair of relatively distant semiconductor patterns, for example, the second and third semiconductor patterns SP2 and SP3 or the fourth and fifth semiconductor patterns SP4 and SP5.

A first doped region 101 may be in a lower portion of the respective semiconductor patterns SP and a second doped region 102 may be in an upper portion of the respective semiconductor patterns SP. A vertical channel region 103 may be between the first and second doped regions 101 and 102. A conductivity type of the first and second doped regions 101 and 102 may be different from the substrate 100. For example, in the case that the substrate 100 is a p-type, the first and second doped regions 101 and 102 may be n-type. A conductivity type of the vertical channel region 103 may be the same conductivity type as the substrate 100. The first and second doped regions 101 and 102 and the vertical channel region 103 may correspond to source, drain, and channel regions, respectively, of a vertical channel transistor. The first doped region 101 may be configured to connect a plurality of the semiconductor patterns SP with each other. For example, the fourth and fifth semiconductor patterns SP4 and SP5 may be connected by the first doped region 101.

According to example embodiments, the semiconductor patterns SP may be directly connected to the substrate 100. For example, the semiconductor patterns SP may be, for example, portions of the substrate 100. Memory elements 174 may be on the semiconductor patterns SP. The memory element 174 may be, for example, a capacitor including a capacitor lower electrode 173 connected to the second doped region 102 via a plug 171 and a capacitor upper electrode 172 opposite the capacitor lower electrode 173. According to other example embodiments, the memory element 174 may be a capacitor, a ferroelectric capacitor, a magnetic tunnel junction (MTJ), a variable resistance element, and/or a charge storing element.

First gate patterns 141 may be between the semiconductor patterns SP. The first gate patterns 141 may be on sidewalls of the semiconductor patterns SP and may extend along the y-direction. The first gate patterns 141 may serve as word lines of the semiconductor device. The first gate patterns 141 may be adjacent to the vertical channel region 103. The first gate patterns 141 may include at least one conductive layer, for example, a doped silicon layer, a metal layer, and/or a conductive metal nitride layer. A first gate insulating layer 135 may be between the first gate pattern 141 and the semiconductor pattern SP. According to some example embodiments, the first gate insulating layer 135 may include, for example, a silicon oxide layer. The first gate pattern 141, the first gate insulating layer 135, and the semiconductor pattern SP may constitute a vertical channel transistor according to example embodiments of the inventive concepts.

The first gate patterns 141 may be between the semiconductor patterns SP defining x-direction next nearest pairs, for example, between the fourth and fifth semiconductor patterns SP4 and SP5. The first gate patterns 141 may be on facing sidewalls of the semiconductor patterns SP constituting the next nearest pairs, respectively. The first gate patterns 141 may be spaced apart from each other between the semiconductor patterns constituting a next nearest pair. For example, the first gate patterns 141 may be on opposing sidewalls of the fourth and fifth semiconductor patterns SP4 and SP5, respectively. According to example embodiments, the first gate patterns 141 may be, for example, plate shaped.

Conductive lines 111 may cross the first gate patterns 141. The first gate patterns 141 may be electrically isolated from the conductive lines 111. The conductive lines 111 may serve as bit lines of a semiconductor device according to example embodiments of the inventive concepts. The conductive lines 111 may extend along the x-direction. The conductive lines 111 may include at least one conductive layer, for example, a doped silicon layer, a metal layer, and/or a metal nitride layer. A lower insulating pattern 119 may be between the conductive lines 111 and the substrate 100. Due to the lower insulating pattern 119, the conductive lines 111 may be spaced apart from the substrate 100 thereunder.

Second gate patterns 151 may be in regions between the semiconductor patterns SP. The second gate patterns 151 may be spaced apart from the first gate patterns 141 by the semiconductor patterns SP. As illustrated in FIG. 2, the second gate pattern 151 may include a first portion BG1 extending along a direction parallel to the first gate patterns 141 and a second portion BG2 extending along a direction parallel to the conductive lines 111. The first portion BG1 and the second portion BG2 may be electrically connected to each other. The first and second portions BG1 and BG2 may be, for example, of substantially the same material.

According to example embodiments, a top surface of the second gate pattern 151 may be lower than a top surface of the first gate pattern 141. A second gate insulating layer 136 may be between the first portion BG1 and the semiconductor patterns SP and between the second portion BG2 and the conductive lines 111. According to some example embodiments, the second gate insulating layer 136 may include, for example, a silicon oxide layer. The first portion BG1 and the first doped region 101 may be formed to be in contact with the second gate insulating layer 136.

The first portion BG1 may be between the semiconductor patterns SP defining the nearest pairs, for example, between the third and fourth semiconductor patterns SP3 and SP4. Sidewalls of each of the semiconductor patterns SP may face the first gate pattern 141 and the first portion BG1 of the second gate pattern 151, respectively. A shape of the first portion BG1 may be variously modified according to fabrication methods. For example, as illustrated in FIG. 2, the first portion BG1 may include first and second extended portions EX1 and EX2 that extend down toward the substrate 100 from a bottom surface of the first portion BG1. The first and second extended portions EX1 and EX2 may be in direct contact with sidewalls of one of two adjacent second portions BG2, but they may be spaced apart from the other of the two adjacent second portions BG2.

According to example embodiments, bottom surfaces of the extended portions EX1 and EX2 may be located at substantially the same level as a bottom surface of the second portion BG2. In other example embodiments, as illustrated in FIG. 3, the first portion BG1 may be formed without the extended portions EX1 and EX2. For example, the bottom surface of the first portion BG1 may be located at a higher level than a top surface of the second portion BG2. The bottom surface of the first portion BG1 may be located at a lower level than a top surface of the first doped region 101. For example, the first doped region 101 may be penetrated by the first portion BG1. According to at least one example embodiment, the first portion BG1 may not penetrate the first doped region 101. The bottom surface of the first portion BG1 may be located at a higher level than a bottom surface of the first doped region 101.

The second portions BG2 may be between every pair of the semiconductor patterns SP arranged along a running direction of the first gate pattern 141 (e.g., the x-direction), for example, not only between the semiconductor patterns SP defining the nearest pairs, for example, between the first and second semiconductor patterns SP1 and SP2, but also between the semiconductor patterns SP defining the next nearest pair, for example, between the second and third semiconductor patterns SP2 and SP3. By contrast, the conductive lines 111 may be partially between the semiconductor patterns SP defining the next nearest pair, for example, the second and third semiconductor patterns SP2 and SP3. The conductive lines 111 may be on opposing sidewalls, respectively, of the semiconductor patterns SP defining the next nearest pair (for example, on opposite sidewalls of the second and third semiconductor patterns SP2 and SP3). The second portion BG2 may be between the conductive lines 111. A bottom surface of the second portion BG2 may be located at a lower level then a bottom surface of the conductive lines 111.

As integration density of the semiconductor device increases, spaces between bit lines thereon may become smaller and smaller. According to example embodiments of the inventive concepts, the second portion BG2 of the second gate pattern 151 may be provided between the conductive lines 111. Because the second portion BG2 may include an electrically conductive layer, the second portion BG2 may serve as a shielding element between the conductive lines 111. An electrical disturbance between the conductive lines 111 serving as the bit lines may be suppressed and/or reduced.

Figure 4:
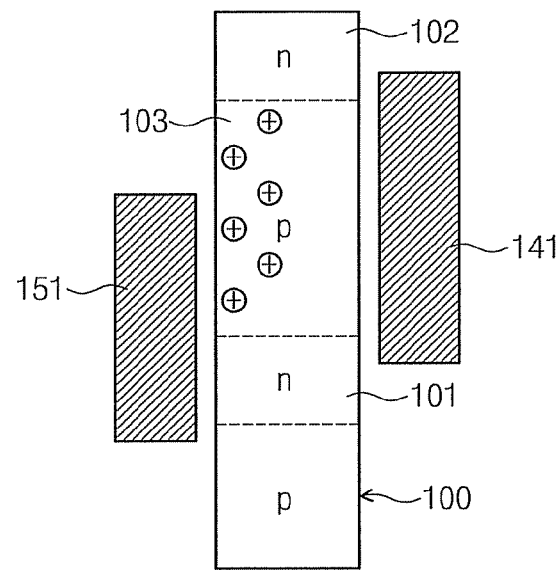
Figure 5:
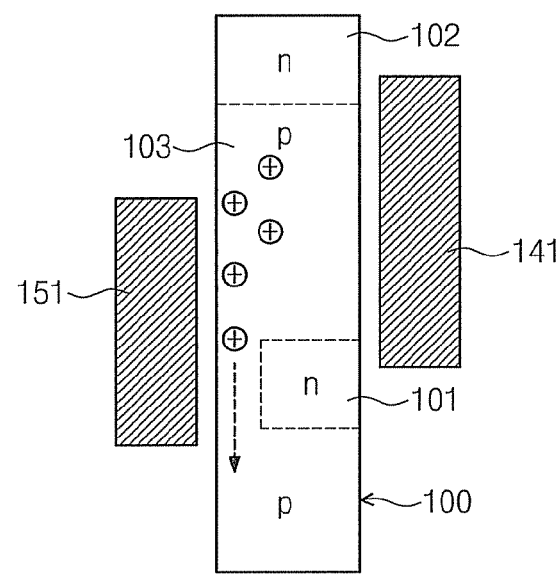

FIGS. 4 and 5 are sectional diagrams illustrating some aspects of vertical channel transistors according to example embodiments of the inventive concepts. Referring to FIGS. 4 and 5, in the case that the first and second doped regions 101 and 102 are n-type, the first gate patterns 141 may be an n-type metal oxide silicon field effect transistor (NMOSFET), in conjunction with the first and second doped regions 101 and 102 and the vertical channel region 103. The second gate pattern 151 (for example, the first portion BG1) may be a PMOSFET in conjunction with the first doped region 101 as a vertical channel region. The vertical channel region 103 may be electrically isolated from the substrate 100 by the first doped region 101 and may be in a floating state. In this case, holes, for example, created by a gate induced drain leakage (GIDL), may be accumulated in the vertical channel region 103, as illustrated in FIG. 4. The hole accumulation may result in floating body effects, for example, a threshold voltage variation, a deterioration of a dynamic refresh property, and/or a capacitor voltage reduction.

For the vertical channel transistor, a threshold voltage thereof may be changed due to a channel width reduction, but according to example embodiments of the inventive concepts, this effect may be suppressed and/or reduced. A portion of the first doped region 101 may be brought into an inversion state (e.g., p-type) by applying a voltage to the second gate pattern 151. According to some example embodiments, the second gate pattern 151 may be biased with a voltage of, for example, about −2 V to about −1 V. An electric path for discharge of the accumulated holes from the vertical channel region 103 may be formed in the semiconductor pattern SP, although formation of the electric path is dependent on a voltage applied to the second gate pattern 151. Because the second gate pattern 151 may be at one side of the vertical channel region 103, an electric potential of the vertical channel region 103 may be controlled by not only the first gate pattern 141 but also the second gate pattern 151.

Figure 6:
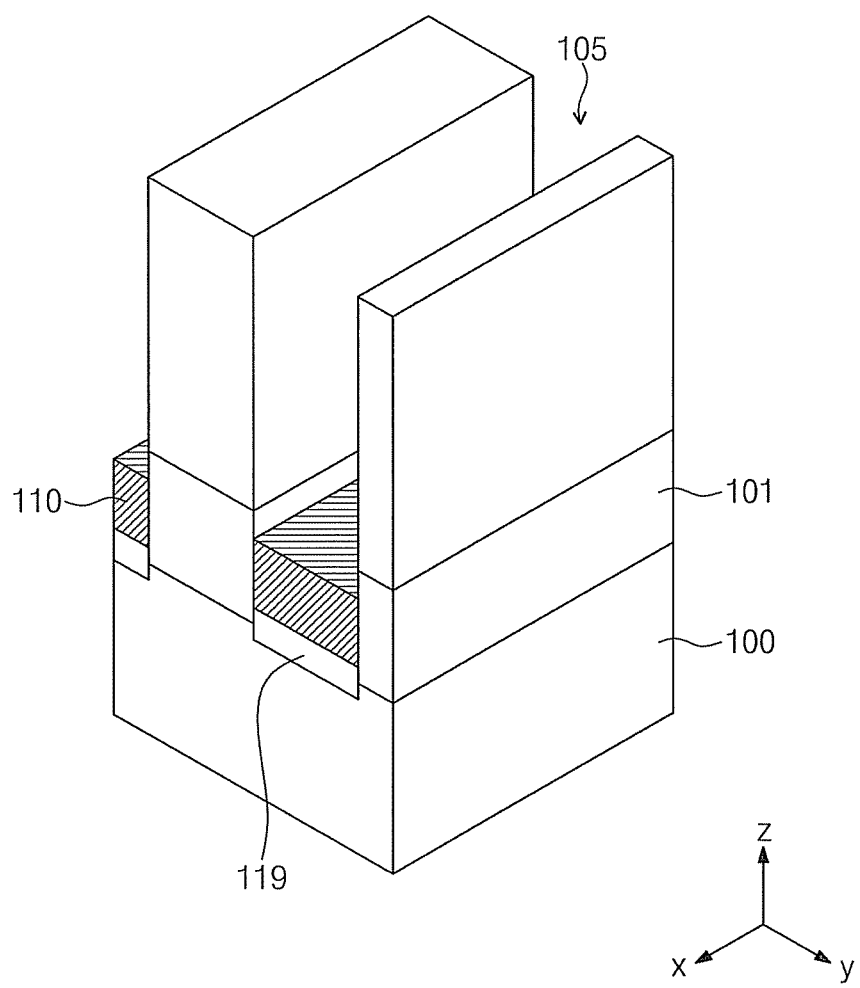

FIGS. 6-23 are perspective or sectional diagrams illustrating methods of fabricating semiconductor devices according to example embodiments of the inventive concepts. Referring to FIG. 6, a first doped region 101 may be formed in a substrate 100. According to some example embodiments, the first doped region 101 may be formed by doping the substrate 100 with, for example, n-type impurity ions to a depth. First trench 105 may be formed on the substrate 100 and a lower insulating pattern 119 may be formed in the first trench 105. The first trench 105 may extend along the x-direction. A surface in the bottom of the first trench 105 may be located at a lower level than a bottom surface of the first doped region 101. The first trench 105 may penetrate the first doped region 101.

The formation of the lower insulating pattern 119 may include forming an insulating layer to fill the first trench 105 and etching the insulating layer using, for example, an etch-back method. The lower insulating pattern 119 may include, for example, a silicon oxide layer, a silicon nitride layer, and/or a silicon oxynitride layer. According to example embodiments, forming order of the first trench 105, the first doped region 101, and the lower insulating pattern 119 may be changed from that of the previously described example embodiments.

A first conductive layer 110 may be formed on the lower insulating pattern 119. The first conductive layer 110 may include, for example, a doped silicon layer, a metal layer, and/or a metal nitride layer. The formation of the first conductive layer 110 may include filling the first trench 105 with a conductive layer and etching the conductive layer to a depth using, for example, an etch-back method. According to example embodiments, a top surface of the first conductive layer 110 may be located at a lower level than a top surface of the first doped region 101.

Figure 7:
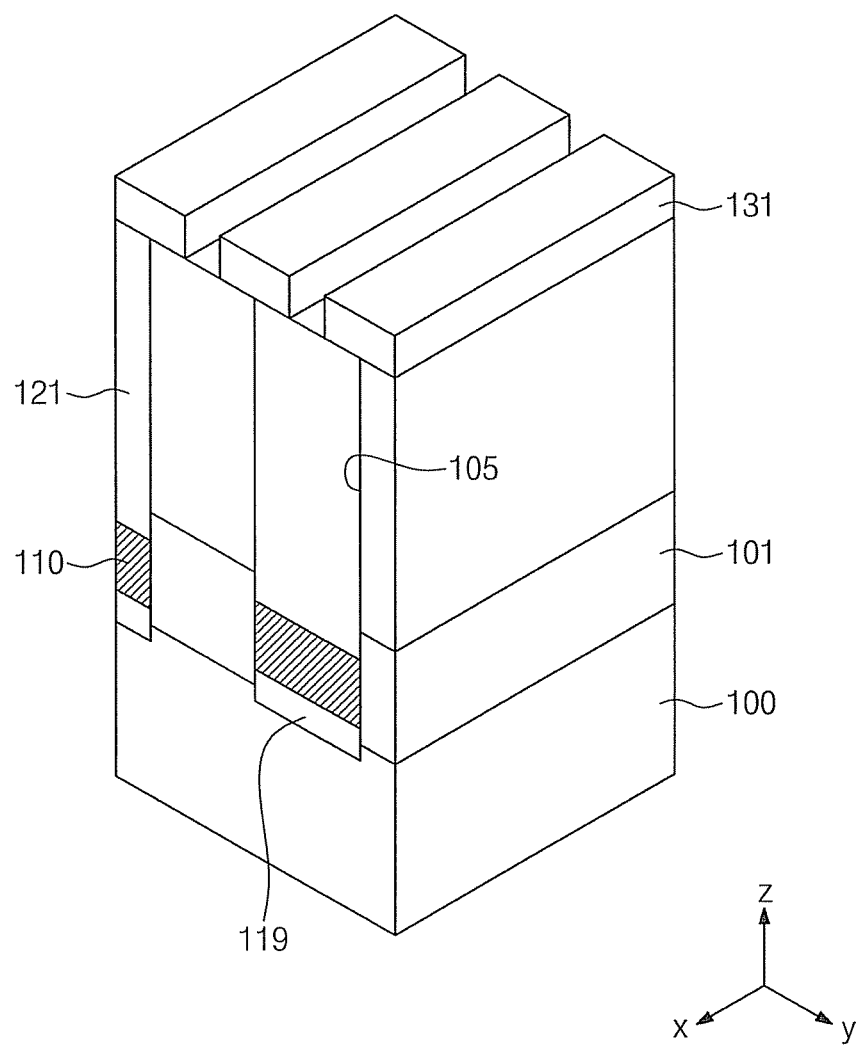

Referring to FIG. 7, a first insulating layer 121 may be formed to fill the first trench 105. The first insulating layer 121 may be on the first conductive layer 110. The first insulating layer 121 may include, for example, a silicon oxide layer, a silicon nitride layer, and/or a silicon oxynitride layer. The first insulating layer 121 may be formed to expose a top surface of the substrate 100. According to example embodiments of the inventive concepts, the semiconductor patterns SP may be formed by patterning a portion of the substrate 100, and hereinafter, the top surface of the substrate 100 may refer to a surface of the substrate 100 directly covered by a bottom surface of a first mask pattern.

The first mask patterns 131 may be formed on the resultant structure including the first insulating layer 121. The first mask patterns 131 may include, for example, a silicon oxynitride layer and/or a silicon nitride layer. The first mask patterns 131 may include a plurality of strips extending along the x-direction. The plurality of strips may be formed to expose top surfaces of the first insulating layer 121 and the substrate 100 in an alternating manner.

Figure 8:
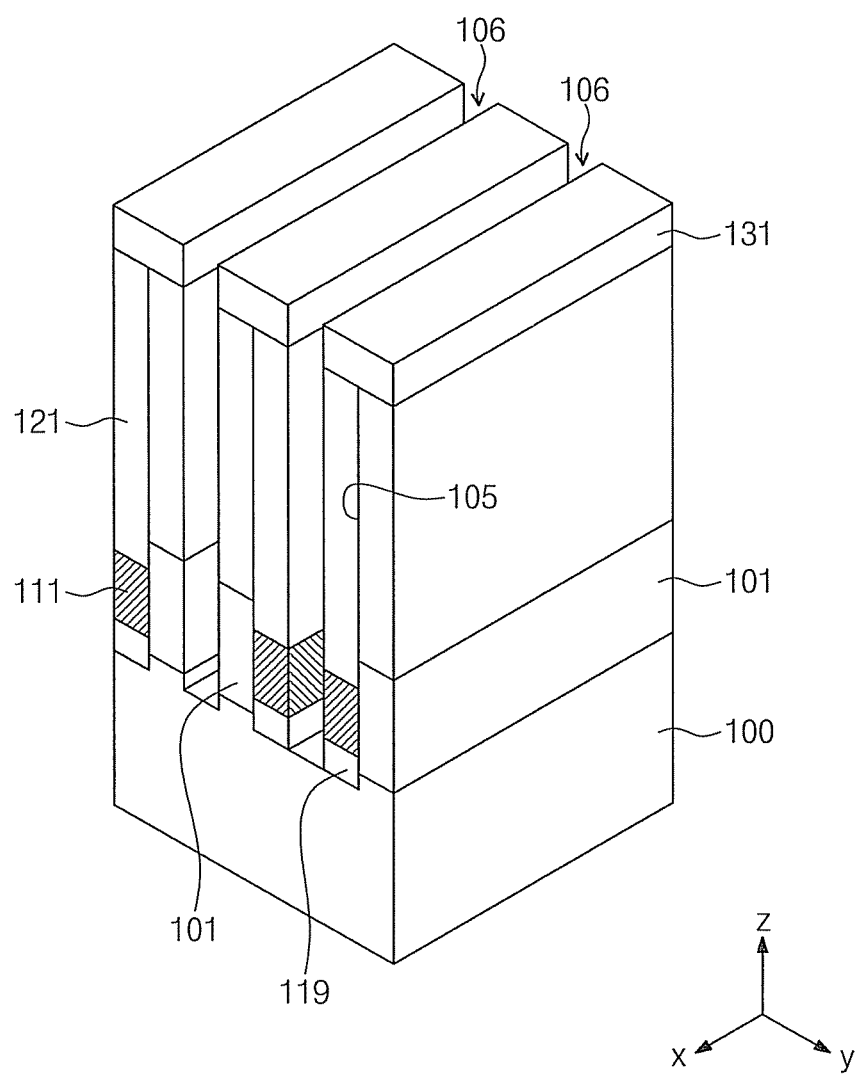

Referring to FIG. 8, second trenches 106 may be formed by patterning the substrate 100 and the first insulating layer 121 using the first mask pattern 131 as an etch mask. Due to the formation of the second trenches 106, the first conductive layer 110 may be patterned to form conductive lines 111. The lower insulating pattern 119 may be patterned along with the first conductive layer 110, during the formation of the second trenches 106. Due to the formation of the second trenches 106, the substrate 100 may include plate-shaped upper portions extending along the x-direction. A bottom surface of the second trench 106 may be located at a lower level than a bottom surface of the first doped region 101.

The formation of the second trenches 106 may be performed using, for example, an anisotropic etch method. According to some example embodiments, the formation of the second trenches 106 may include a plurality of etch steps. For example, the upper portion of the substrate 100 and the first insulating layer 121 may be patterned using different etch processes from each other. The formation of the conductive lines 111 may be performed using an independent etch process, which is not used to etch the substrate 100 and the first insulating layer 121. The first mask pattern 131 may be removed, for example, after the formation of the second trenches 106 and/or in a subsequent process.

Figure 9:
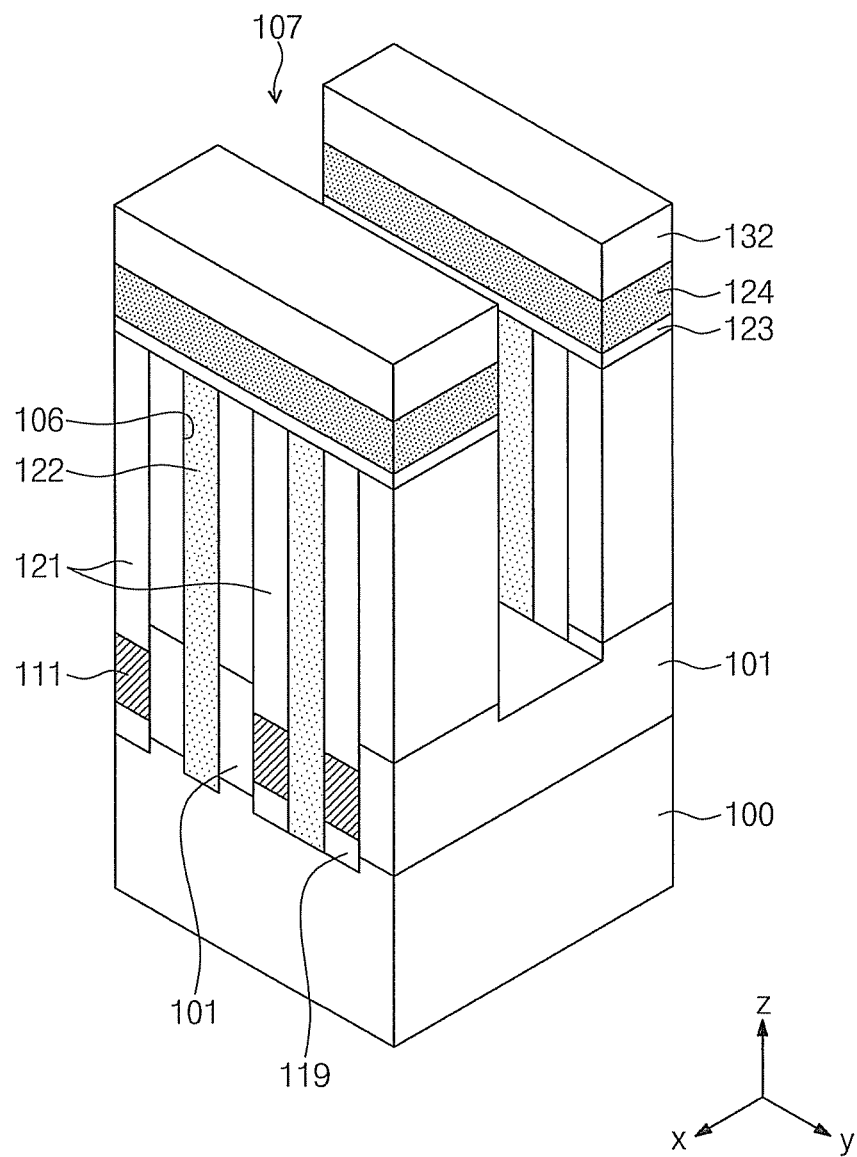

Referring to FIG. 9, a second insulating layer 122 may be formed in the second trench 106. The second insulating layer 122 may be formed of a material with etch selectivity to the first insulating layer 121. For example, the first insulating layer 121 may be formed of a material that is etched at a slower rate than a material of the second insulating layer 122 during a process of etching the second insulating layer 122. According to some example embodiments, in the case that the first insulating layer 121 is formed of silicon oxide, the second insulating layer 122 may be formed of silicon nitride.

An etch stop layer 123, a sacrificial layer 124, and a second mask pattern 132 may be formed on the resultant structure including the second insulating layer 122. According to some example embodiments, the etch stop layer 123 may be formed of a silicon nitride, and the sacrificial layer 124 may be formed of a polysilicon. A patterning process using the second mask pattern 132 as an etch mask may be performed to form third trenches 107 extending along the y-direction. A bottom surface of the third trench 107 may be formed to expose the first doped region 101. The conductive lines 111 may not be exposed by the third trench 107. The second mask pattern 132 may be removed after the patterning process.

Figure 10:
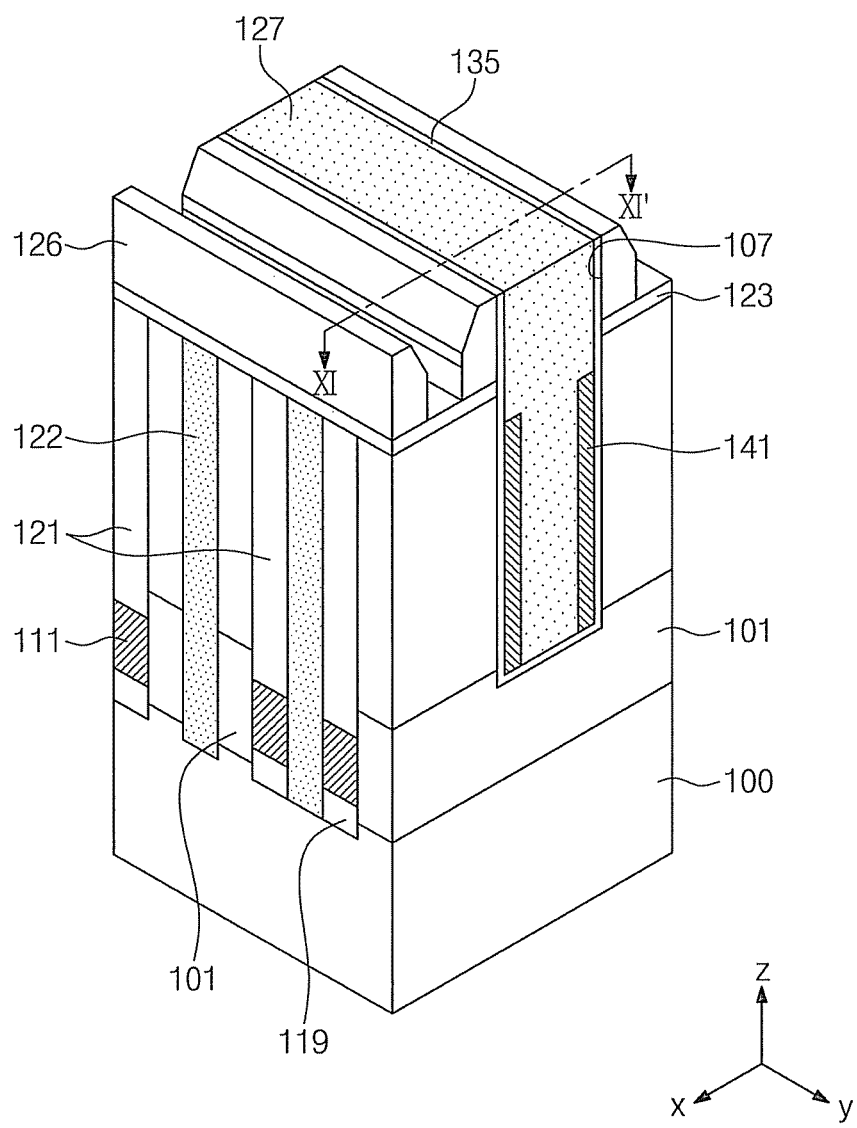
Figure 11:
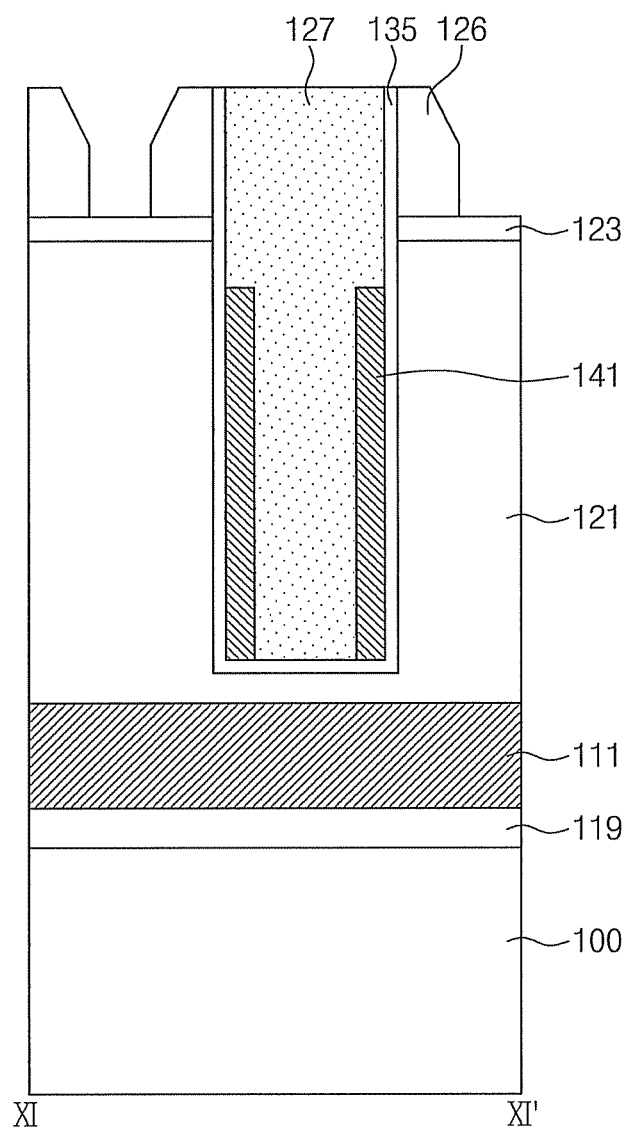

Referring to FIGS. 10 and 11, a first gate insulating layer 135 and first gate patterns 141 may be formed in the third trench 107. FIG. 11 is a sectional view taken along line XI-XI' of FIG. 10. The first gate insulating layer 135 may be formed to cover a bottom surface and inner walls of the third trench 107. The first gate patterns 141 may be formed using, for example, a spacer forming process. For example, the formation of the first gate patterns 141 may include forming a second conductive layer (not shown) on the first gate insulating layer 135 and anisotropically etching the second conductive layer to expose the first gate insulating layer 135. The first gate patterns 141 may be formed on both of the inner walls of the third trench 107, respectively.

The formation of the first gate patterns 141 may include, for example, removing upper portions of the first gate patterns 141 in a dry etch manner. As illustrated in FIGS. 10 and 11, a top surface of the first gate patterns 141 may be lower than a top surface of the substrate 100. The first gate patterns 141 may be spaced apart from the conductive lines 111 by the first gate insulating layer 135 and the first insulating layer 121. The first gate patterns 141 may include, for example, a doped silicon layer, a metal layer, and/or a conductive metal nitride layer. The first gate insulating layer 135 may include, for example, a silicon oxide layer. A third insulating layer 127 may be formed to fill the third trench 107. The third insulating layer 127 may include, for example, a silicon oxide layer.

The formation of the third insulating layer 127 may include filling the third trench 107 with an insulating layer and planarizing the insulating layer to expose the sacrificial layer 124 illustrated in FIG. 9. The exposed sacrificial layer 124 may be removed by, for example, a selective etch process. For example, the removal of the sacrificial layer 124 may be performed using an etch solution capable of selectively removing a polysilicon layer. During the removal of the sacrificial layer 124, the upper portions of the substrate 100 can be protected by the etch stop layer 123. Spacers 126 may be formed in a space made by the removal of the sacrificial layer 124. The spacer 126 may be formed to expose a portion of the etch stop layer 123. The spacer 126 may include, for example, a silicon oxide layer and/or a silicon oxynitride layer.

Figure 12:
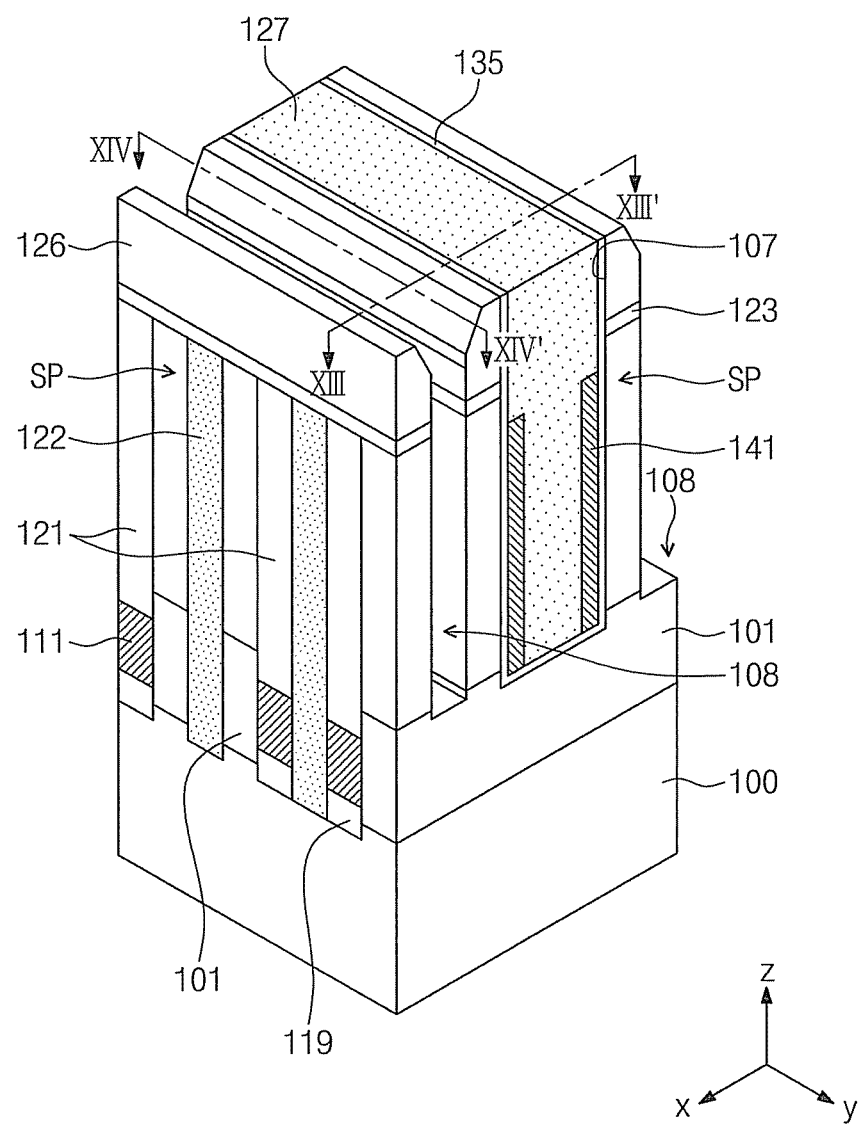
Figure 13:
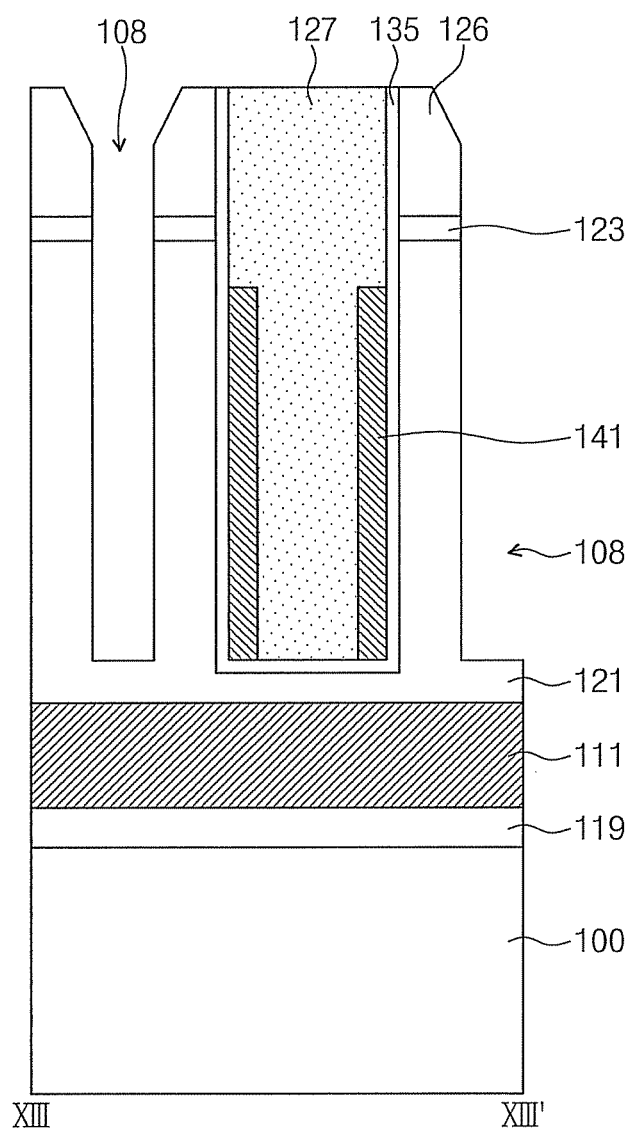
Figure 14:
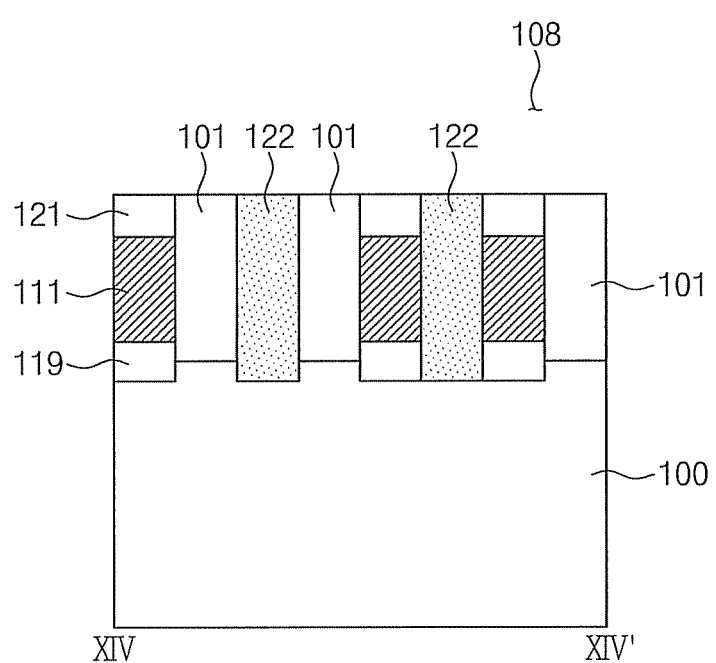

Referring to FIGS. 12-14, semiconductor patterns SP may be formed by patterning layers disposed under the etch stop layer 123 and the etch stop layer 123. The spacer 126 and the third insulating layer 127 may be used as an etch mask during the formation of semiconductor patterns SP. FIGS. 13 and 14 are sectional views taken along lines XIII-XIII' and XIV-XIV' of FIG. 12, respectively. As the result of the patterning process, a fourth trench 108 may be formed to be parallel to y-direction. A bottom surface of the fourth trench may expose the first doped region 101. As shown in FIG. 13, a bottom surface of the fourth trench 108 may be formed not to expose the conductive lines 111. According to some example embodiments, top surfaces of the first insulating layer 121, the first doped region 101, and the second insulating layer 122 may be located at substantially the same level as shown in FIG. 14. According to at least one example embodiment, top surfaces of the first insulating layer 121, the first doped region 101, and the second insulating layer 122 may be located at different levels from each other, depending on the etch methods used.

Figure 15:
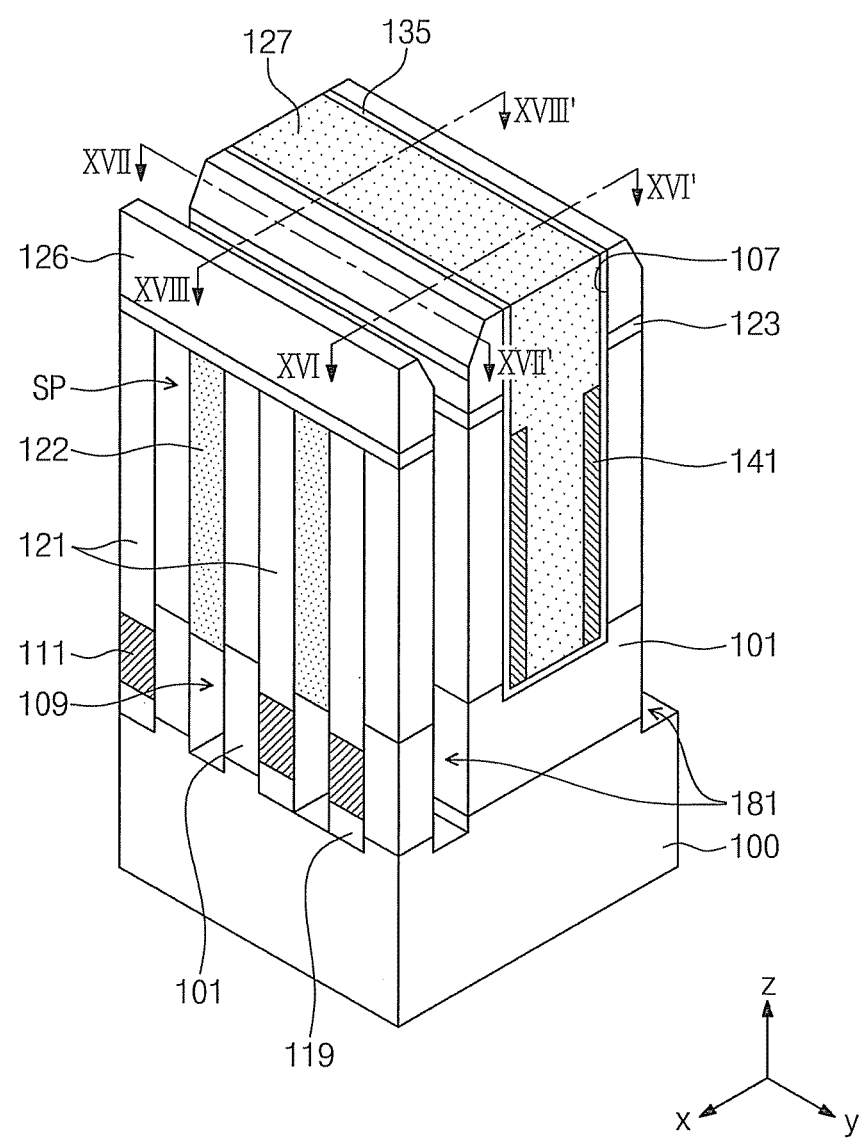
Figure 16:
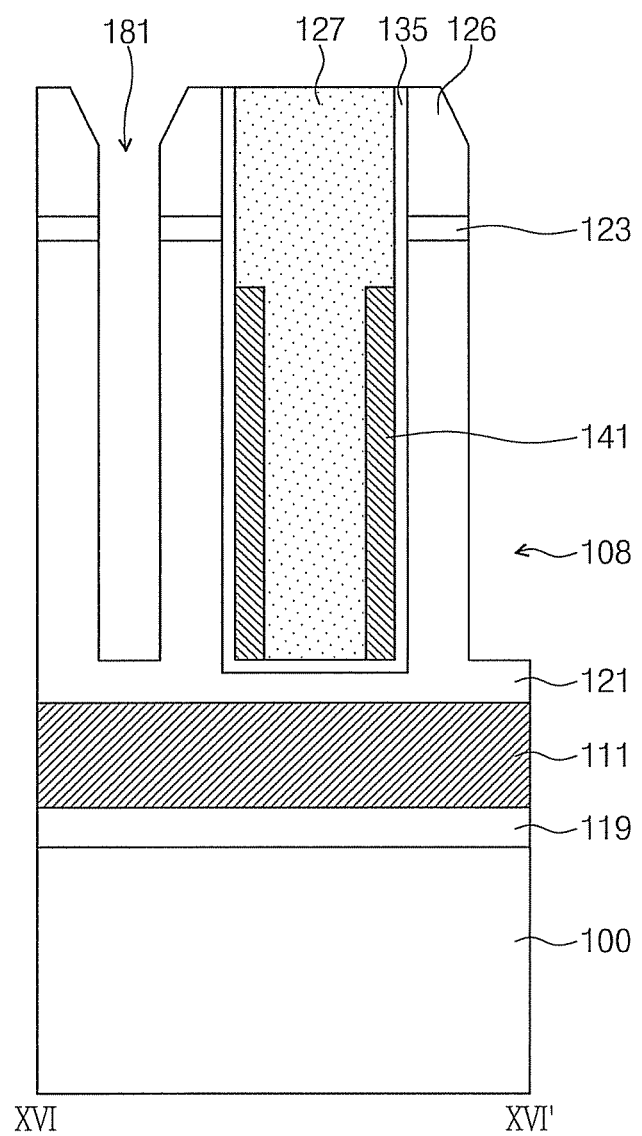
Figure 17:
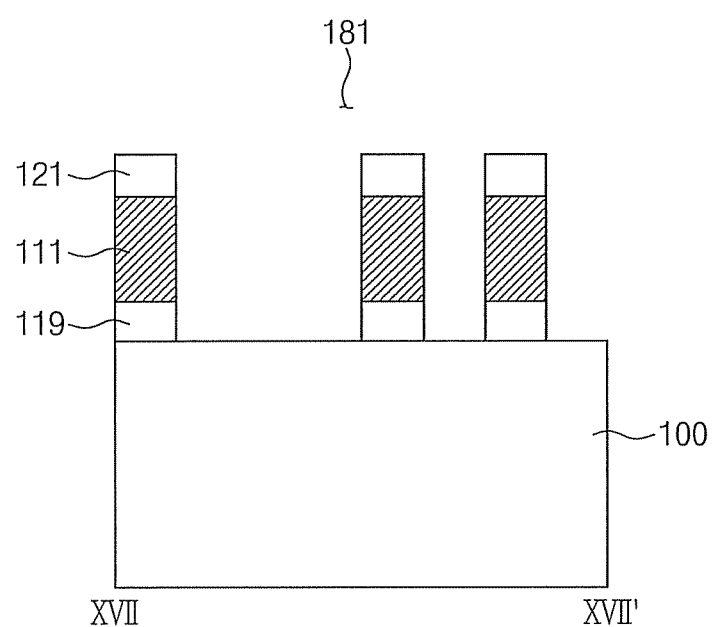
Figure 18:
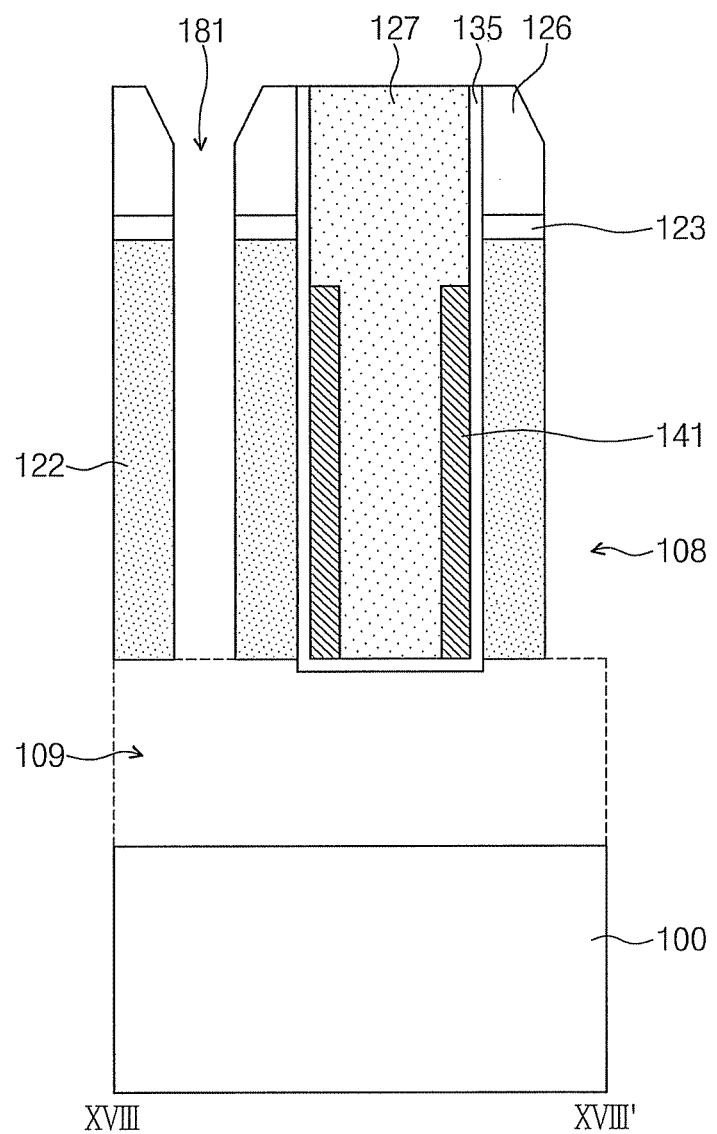
Figure 19:
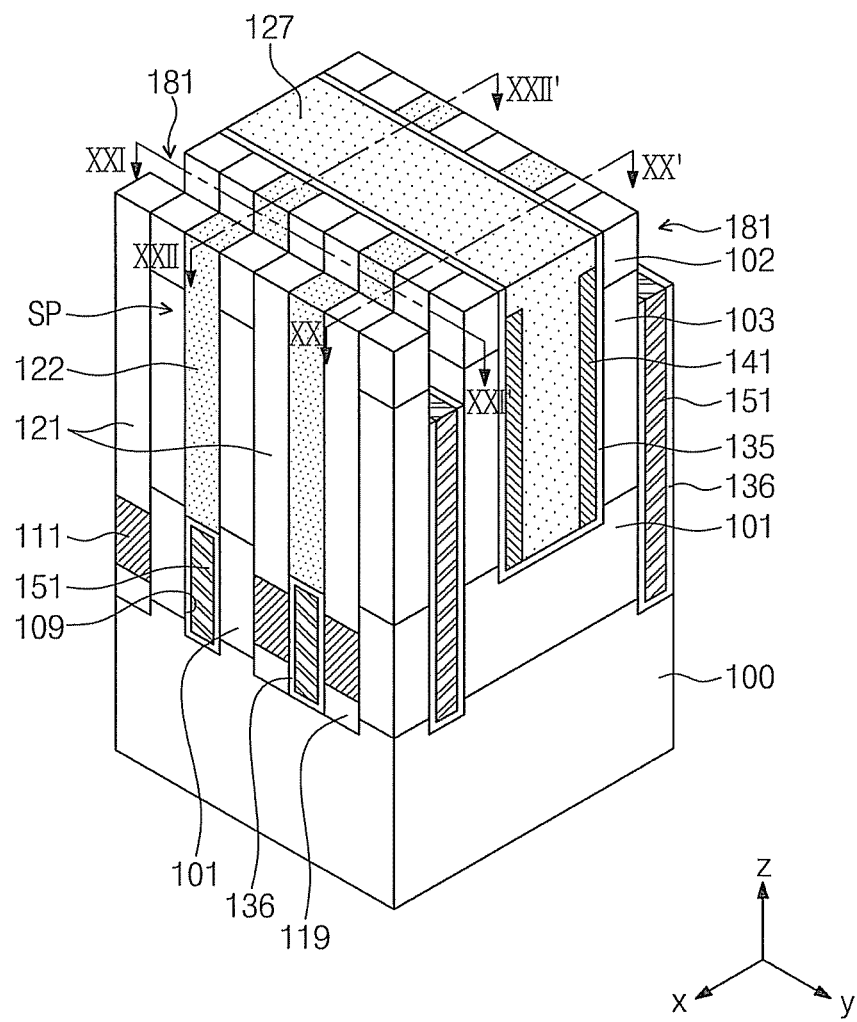

Referring to FIG. 15, a fifth trench 181 may be formed by etching the first doped region 101 exposed by the fourth trench 108. Here, FIGS. 16-18 are sectional views taken along lines XVI-XVI', XVII-XVII' and XVIII-XVIII' of FIG. 15, respectively. The formation of the fifth trench 181 may include selectively etching the first doped region 101. For example, the formation of the fifth trench 181 may include forming spacers (not shown) extending along the y-direction on sidewalls of the fourth trench 108 shown in FIG. 12 and selectively etching the first doped region 101 exposed by the spacer. The selective etching of the first doped region 101 may be performed until the first doped region 101 is penetrated by the fifth trench 181. As shown in FIG. 18, a lower portion of the second insulating layer 122 may be selectively etched to form a recess region 109. The recess region 109 may be formed to extend along the x-direction. The recess region 109 may be connected to the fifth trench 181.

According to some example embodiments, similar to the formation of the fifth trench 181, the recess region 109 may be formed by a selective etch process using a spacer. For example, the spacers formed on the sidewalls of the fourth trench 108 may be used as an etch mask preventing an upper portion of the second insulating layer 122 from being etched during the formation of the recess region 109. Layers defining the sidewalls of the fourth trench 108 can be protected by the spacer during the formation of the recess region 109. As the result of the selective etch using the spacer as an etch mask, the first insulating layer 121, the conductive lines 111, and the lower insulating pattern 119 may be prevented from being unintentionally etched and remain as shown in FIGS. 15-17.

Figure 20:
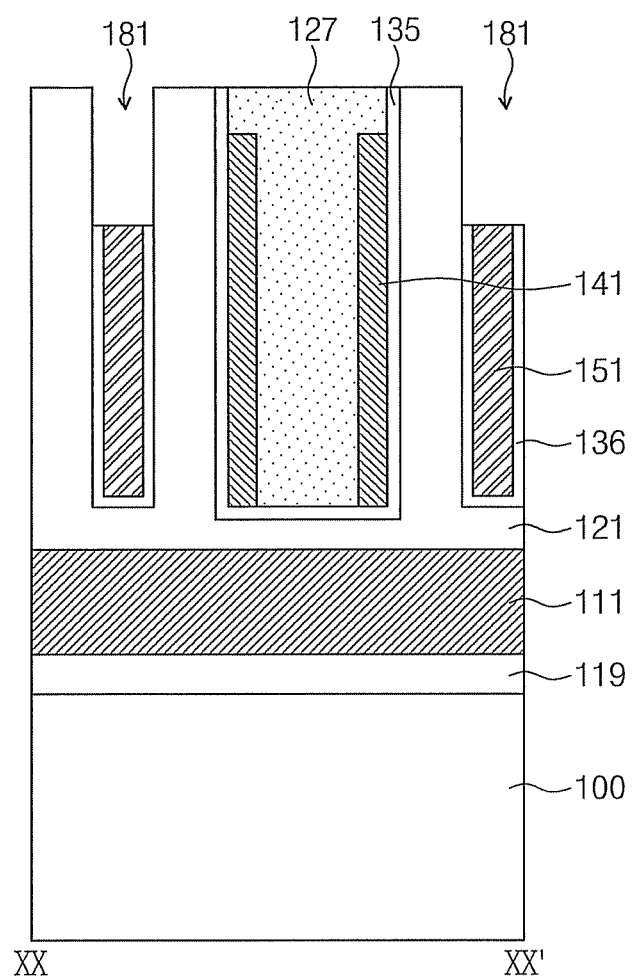
Figure 21:
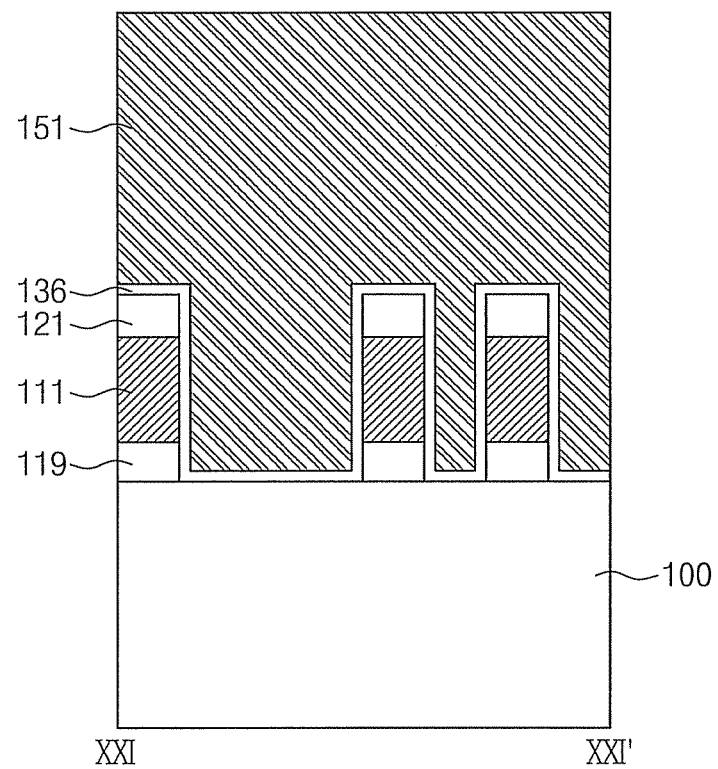
Figure 22:
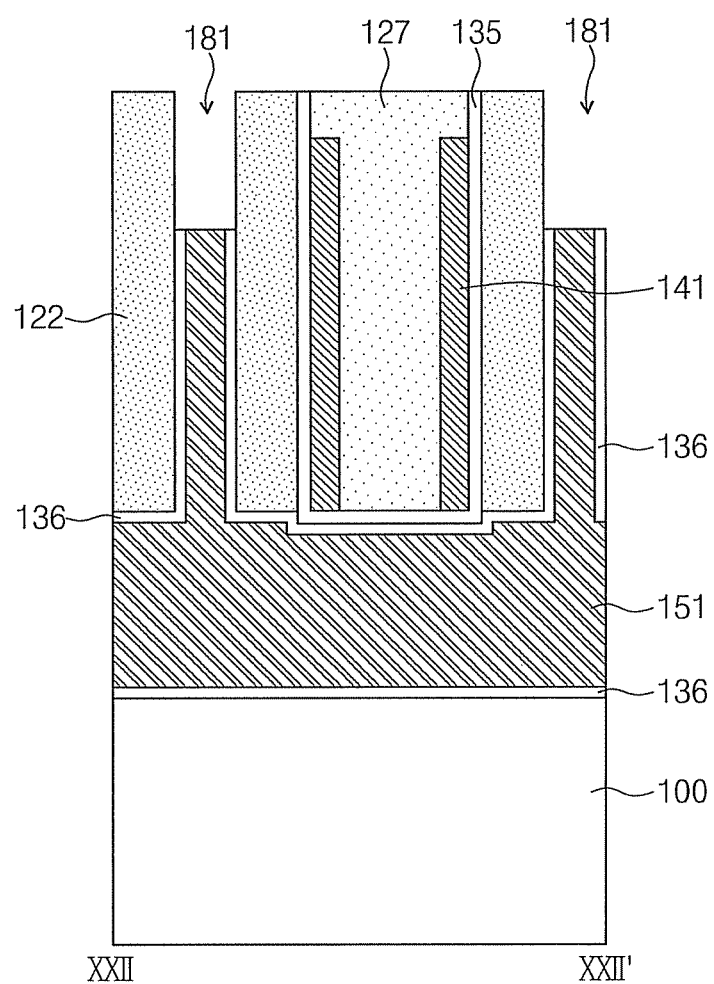

Referring to FIGS. 19-22, a second gate pattern 151 and a second gate insulating layer 136 may be formed in the fifth trench 181 and the recess region 109 connected to the fifth trench 181. FIGS. 20-22 are sectional views taken along lines XX-XX', XXI-XXI' and XXII-XXII' of FIG. 19, respectively. The formation of the second gate pattern 151 and the second gate insulating layer 136 may include forming a second gate insulating layer 136 to cover inner walls of the fifth trench 181 and the recess region 109 and forming a third conductive layer (not shown) to fill the fifth trench 181 and the recess region 109. The second gate pattern 151 may be formed by etching an upper portion of the third conductive layer, for example, in an etch-back manner. The second gate pattern 151 may be spaced apart from the conductive lines 111 by the second gate insulating layer 136. According to other example embodiments, an additional insulating layer may be formed between the second gate pattern 151 and the conductive lines 111.

Second doped regions 102 may be formed in upper portions of the semiconductor patterns SP, respectively. The second doped region 102 may have substantially the same conductivity type as the first doped region 101. For each of the semiconductor patterns SP, a portion between the first and second doped regions 101 and 102 may be defined as a vertical channel region 103.

According to other example embodiments, during the fabrication steps described with reference to FIGS. 15-18, the first doped region 101 may not be further etched after the formation of the fourth trench 108. In this case, the second gate pattern 151 may be formed without any extended portion as shown in FIG. 3.

Figure 23:
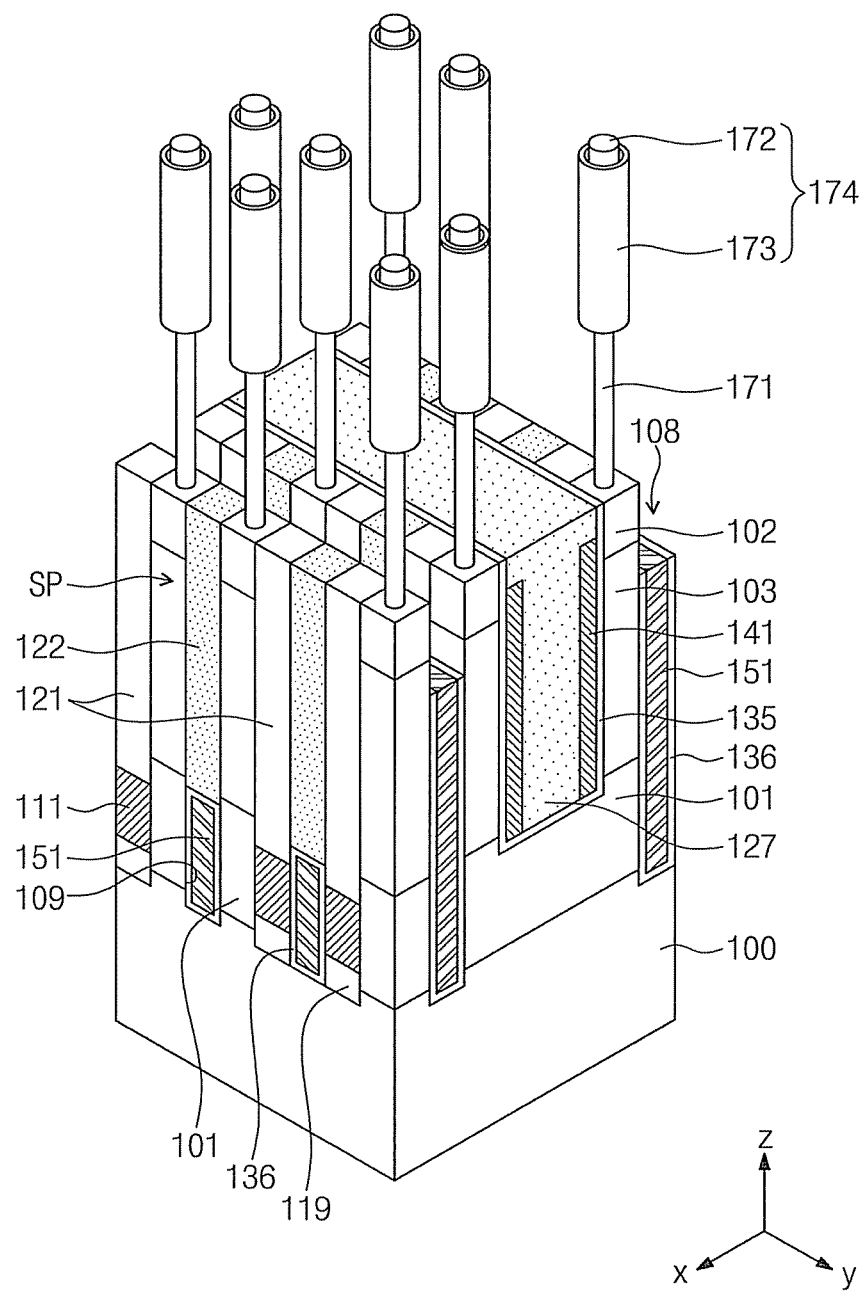

Referring to FIG. 23, memory elements 174 may be formed on the second doped regions 102, respectively. For example, each of the memory elements 174 may be a capacitor including a capacitor lower electrode 173 connected to the second doped region 102 via plugs 171 and a capacitor upper electrode 172 facing the capacitor lower electrode 173.

According to example embodiments of the inventive concepts, it is possible to suppress and/or reduce a floating body effect as well as an electrical disturbance between bit lines. An electric property of the semiconductor device may be improved.

Figure 24:
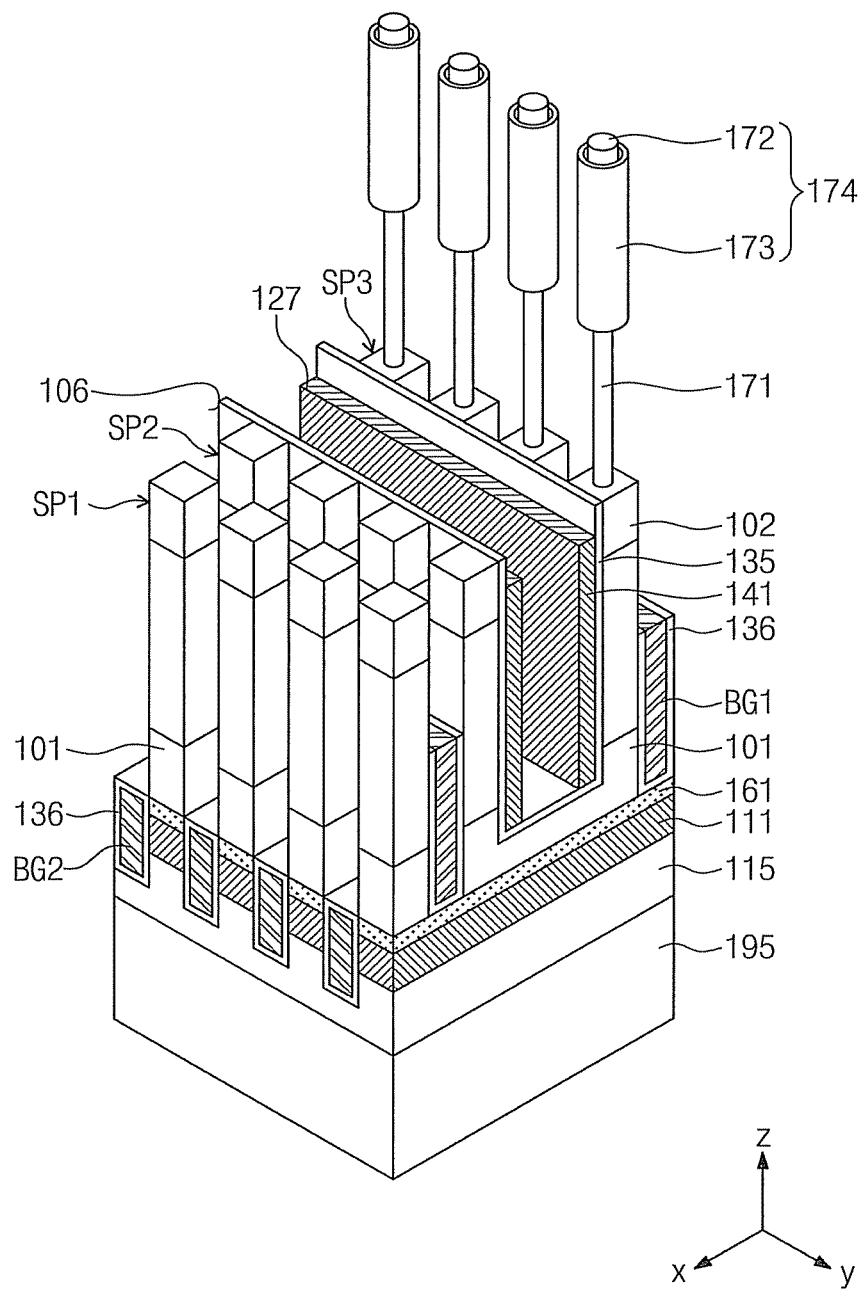

FIG. 24 is a perspective diagram illustrating semiconductor devices according to other example embodiments of the inventive concepts. For concise description, overlapping description of elements or technical features previously described with reference to FIGS. 1-23 may be omitted. Referring to FIG. 24, semiconductor patterns may be provided. For example, the semiconductor patterns may include first, second and third semiconductor patterns SP1, SP2 and SP3. The semiconductor patterns may be two-dimensionally arranged on a top surface of a first semiconductor layer 195. Not all distances between the semiconductor patterns may be equal to each other. According to some example embodiments, an x-directional distance between the first and second semiconductor patterns SP1 and SP2 may be less than that between the second and third semiconductor patterns SP2 and SP3. The first and second semiconductor patterns SP1 and SP2 may be one of the nearest pairs, and the second and third semiconductor patterns SP2 and SP3 may be one of the next nearest pairs. According to example embodiments, distances between the semiconductor patterns in y-direction may be substantially the same.

According to some example embodiments, a second gate pattern may include a first portion BG1 and a second portion BG2. The first portion BG1 may extend parallel to a first gate pattern 141, and may contribute to suppress and/or reduce a floating body effect in the semiconductor pattern. The second portion BG2 may be between conductive lines 111 and may serve as a shielding element. When comparing with the aforementioned example embodiments illustrated in FIGS. 1-3, the semiconductor pattern may not be between the second portion BG2 and the conductive line 111. For example, as shown in FIG. 24, the semiconductor patterns may be disposed on the conductive lines 111.

In the case that the conductive line 111 includes a metal layer, a metal silicide layer 161 may be between the conductive line 111 and the semiconductor patterns thereon. According to some example embodiments, the metal silicide layer 161 may include, for example, a tungsten silicide layer, a cobalt silicide layer and/or a tantalum silicide layer. The metal silicide layer 161 may extend along the x-direction or parallel to the conductive lines 111. The first gate pattern 141 may be spaced apart from the conductive lines 111 by the first doped region 101. According to example embodiments, a lower insulating layer 115 may be under the conductive lines 111 and the second gate pattern 151. The semiconductor patterns may be electrically isolated from the first semiconductor layer 195 by the lower insulating layer 115. According to some example embodiments, the lower insulating layer 115 may include, for example, a silicon oxide layer.

Figure 25:
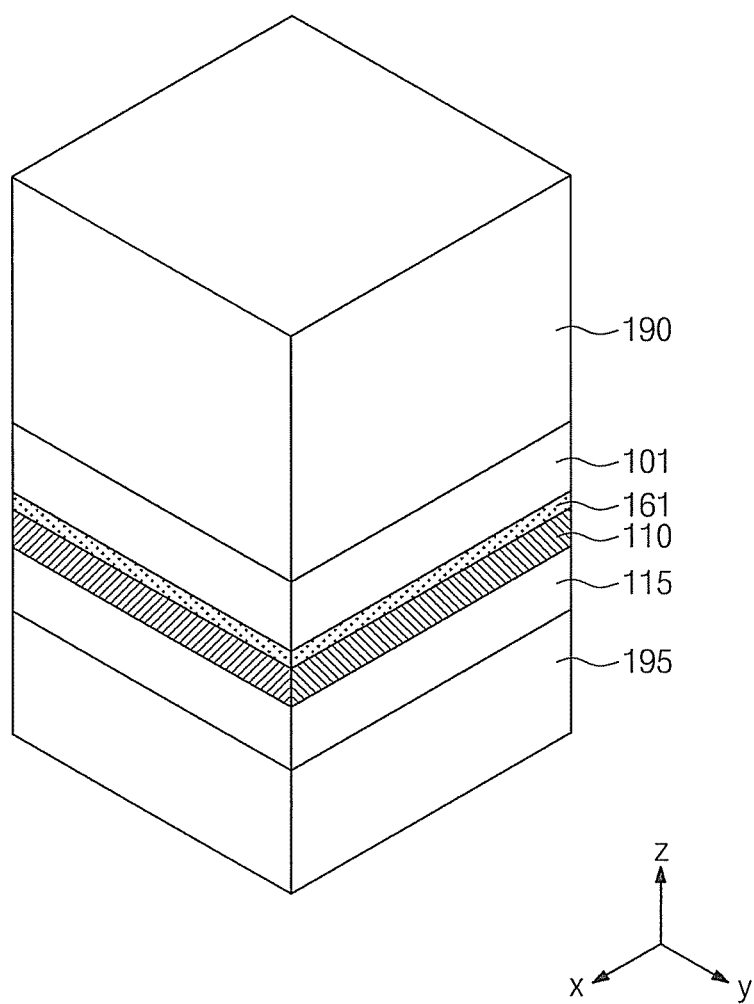

FIGS. 25-30 are perspective diagrams illustrating methods of fabricating semiconductor devices according to other example embodiments of the inventive concepts. Referring to FIG. 25, a stacked structure including a first semiconductor layer 195, a lower insulating layer 115, a first conductive layer 110, and a second semiconductor layer 190 may be provided. A first doped region 101 may be formed in a lower portion of the second semiconductor layer 190. The stacking structure may be formed using various methods. For example, the stacking structure may be prepared by adhering the second semiconductor layer 190 on a silicon-on-insulator (SOI) substrate including the first semiconductor layer 195, the lower insulating layer 115, and the first conductive layer 110 sequentially stacked.

According to other example embodiments, the stacking structure may be prepared by adhering a substrate, which includes the lower insulating layer 115, the first conductive layer 110 and the second semiconductor layer 190, on the first semiconductor layer 195. In the case that the first conductive layer 110 may include a metal layer, a metal silicide layer 161 may be between the first conductive layer 110 and the first doped region 101. Due to the metal silicide layer 161, the first conductive layer 110 may be ohmically connected to the first doped region 101. A conductivity type of the first semiconductor layer 195 may be the same conductivity type as the second semiconductor layer 190. A conductivity type of the first doped region 101 may be a different conductivity type from the first and second semiconductor layer 195 and 190.

Figure 26:
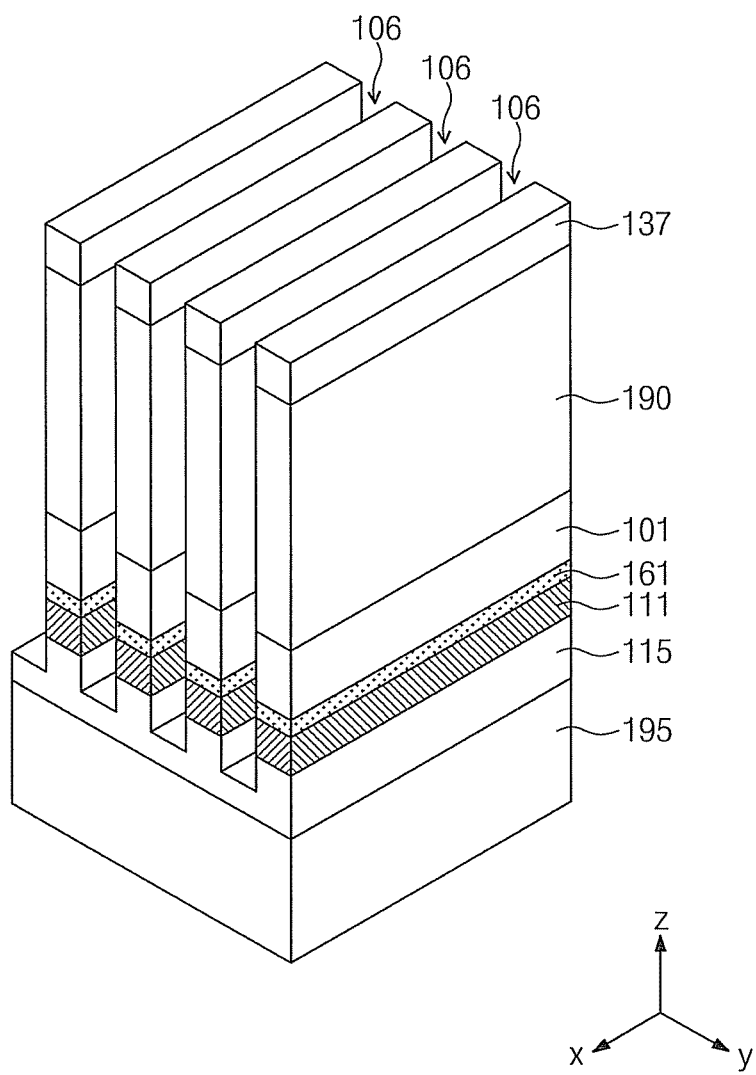

Referring to FIG. 26, the stacking structure may be patterned to form second trenches 106. The formation of the second trenches 106 may be performed using third mask patterns 137 as an etch mask. A bottom surface of the second trench 106 may be located between bottom and top surfaces of the lower insulating layer 115. Due to the formation of the second trench 106, the first conductive layer 110 may be patterned to form conductive lines 111.

Figure 27:
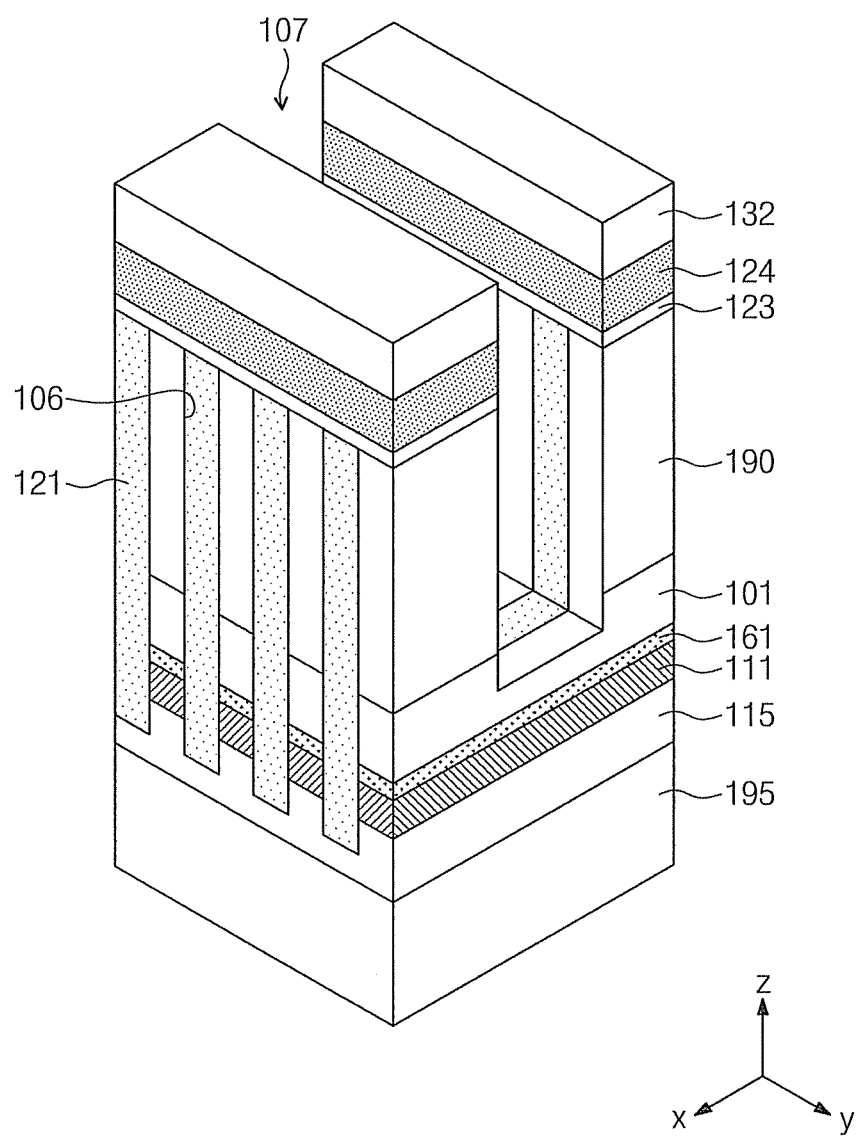

Referring to FIG. 27, first insulating layers 121 may be formed in the second trenches 106. The first insulating layer 121 may be formed to include, for example, a material with etch selectivity to the second semiconductor layer 190. An etch stop layer 123, a sacrificial layer 124, and a second mask pattern 132 may be disposed on the resultant structure provided with the first insulating layer 121. A patterning process using the second mask pattern 132 as an etch mask may be performed to form a third trench 107 extending along the y-direction. The third trench 107 may be formed to expose a surface of the first doped region 101. The second mask pattern 132 may be removed after the patterning process.

Figure 28:
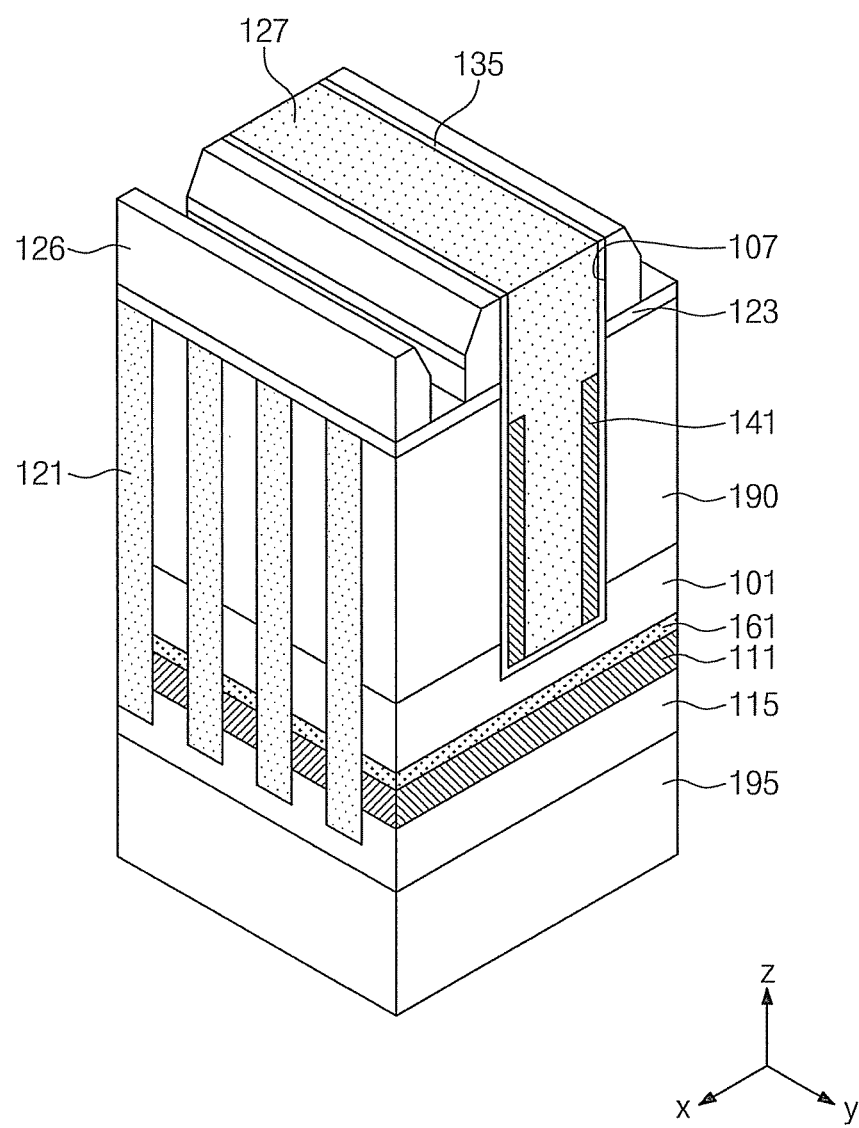

Referring to FIG. 28, a first gate insulating layer 135 and first gate patterns 141 may be formed in the third trench 107. The first gate insulating layer 135 may be formed to cover a bottom surface and sidewalls of the third trench 107. The first gate patterns 141 may be formed using a spacer forming process. As a result of the spacer forming process, the first gate patterns 141 may be formed on both sidewalls of the third trench 107, respectively. After the formation of the first gate patterns 141, a third insulating layer 127 may be formed to fill the third trench 107 provided with the first gate patterns 141 and the first gate insulating layer 135. The third insulating layer 127 may include, for example, a silicon oxide layer. The formation of the third insulating layer 127 may include forming an insulating layer to fill the third trench 107 and planarizing the insulating layer to expose the sacrificial layer 124 of FIG. 27. The sacrificial layer 124 exposed by the planarization process may be removed by a selective etch process. Spacers 126 may be formed in regions made by the removal of the sacrificial layer 124.

Figure 29:
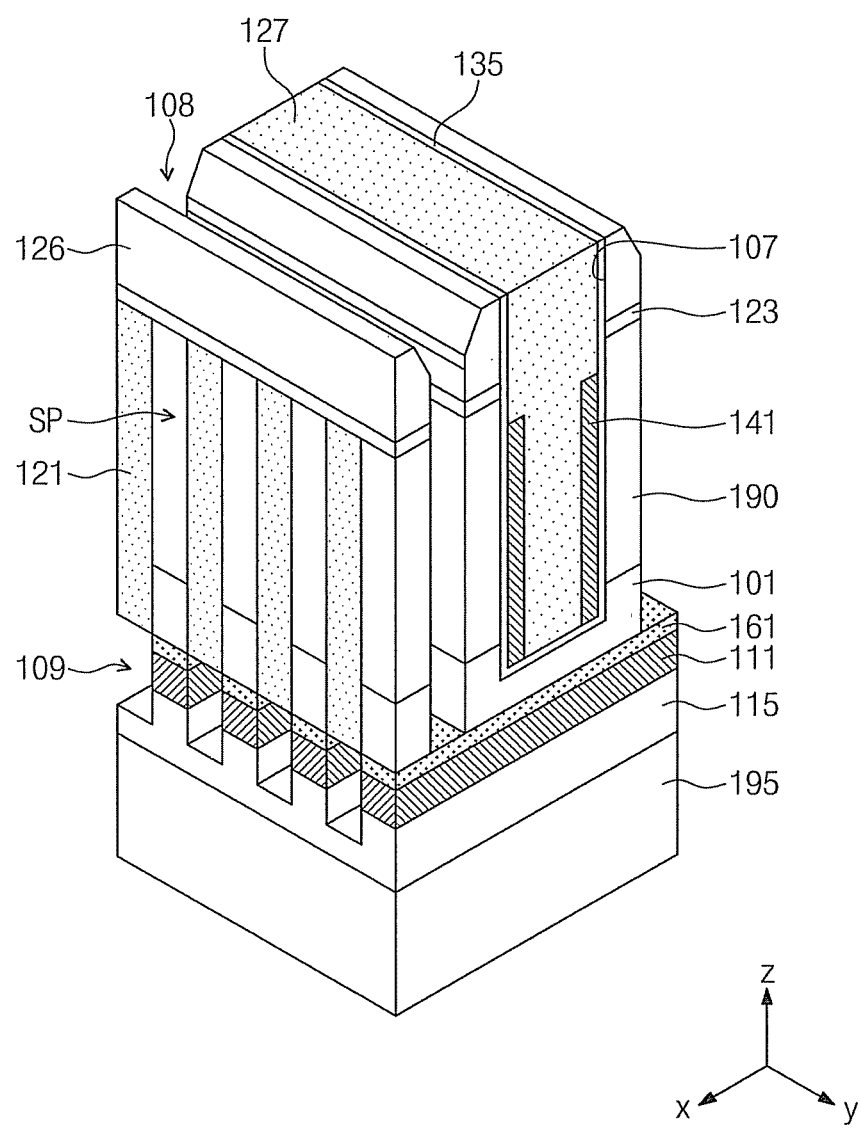

Referring to FIG. 29, the etch stop layer 123 and layers disposed under the etch stop layer 123 may be patterned using the spacer 126 and the third insulating layer 127 as an etch mask. As a result of the patterning process, a fourth trench 108 may be formed to extend along the y-direction. A bottom surface of the fourth trench 108 may be formed to expose the metal silicide layer 161 and the first insulating layer 121. During the formation of the fourth trench 108, the metal silicide layer 161 may be used as an etch stop layer. Due to the fourth trench 108, two-dimensionally arranged semiconductor patterns SP may be formed on the first semiconductor layer 195. At least some of the semiconductor patterns SP may be connected by the first doped region 101.

A recess region 109 may be formed by selectively removing a lower portion of the first insulating layer 121 exposed by the fourth trench 108. The recess region 109 may be formed to extend along the x-direction. The recess region 109 may be connected to the fourth trench 108. The formation of the recess region 109 may include forming spacers (not shown) exposing the first insulating layer 121 and the metal silicide layer 161 on sidewalls of the fourth trench 108, and selectively removing a lower portion of the first insulating layer 121.

Figure 30:
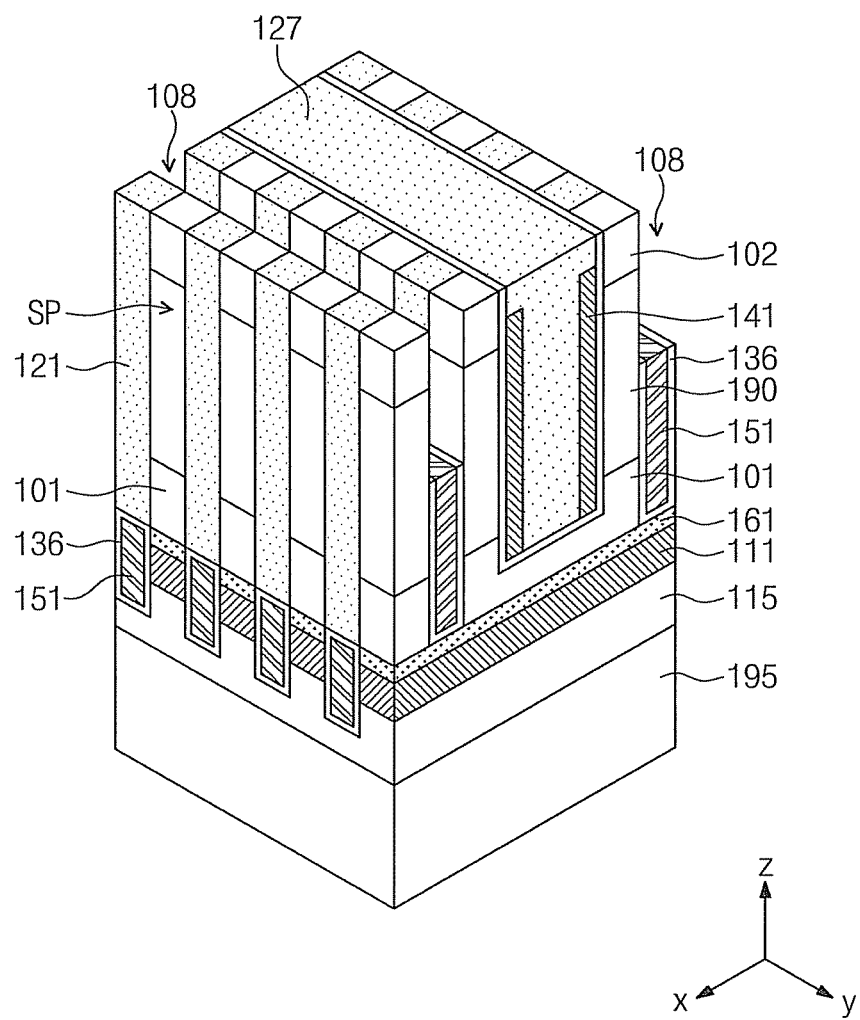

Referring to FIG. 30, a second gate pattern 151 and a second gate insulating layer 136 may be formed in the fourth trench 108 and the recess region 109 connected to the fourth trench 108. The second gate insulating layer 136 may be formed to cover walls inside the fourth trench 108 and the recess region 109, and the second gate pattern 151 may be formed to fill the remaining spaces of the fourth trench 108 and the recess region 109. An upper portion of the second gate pattern 151 may be etched in an etch-back manner to re-expose upper sidewalls of the fourth trench 108. The second gate pattern 151 may be spaced apart from the conductive lines 111 by the second gate insulating layer 136. According to other example embodiments, an additional insulating layer may be formed between the second gate pattern 151 and the conductive lines 111.

Second doped regions 102 may be formed in upper portions of the semiconductor patterns SP, respectively. Memory elements (not shown) may be formed on the second doped regions 102, respectively. According to other example embodiments of the inventive concepts, it is possible to suppress and/or reduce a floating body effect as well as electrical disturbances between the bit lines. As a result, an electric property of the semiconductor device may be improved.

Figure 31:
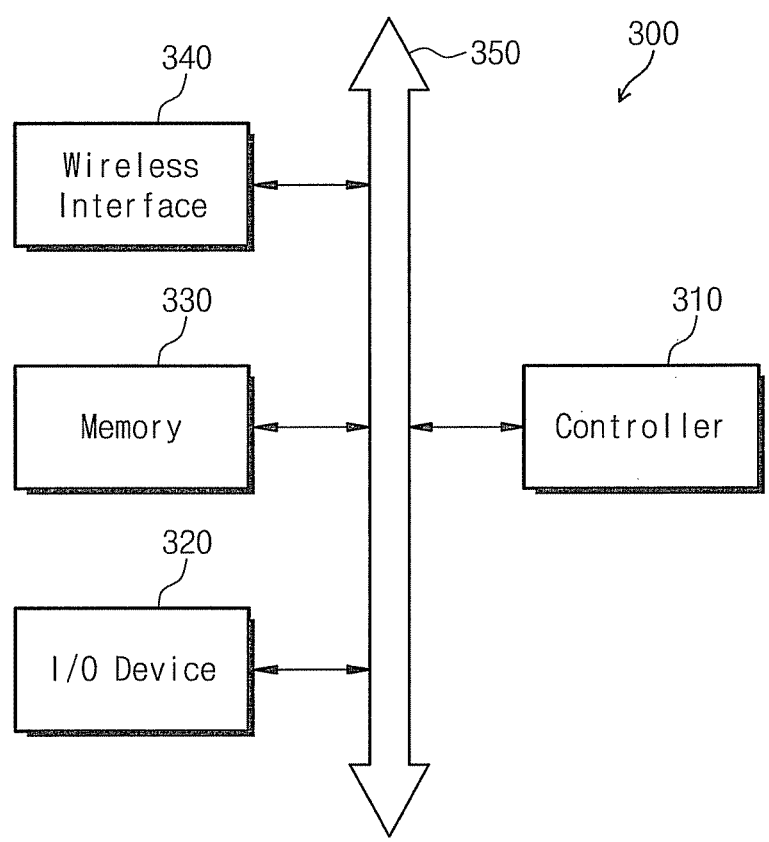

FIG. 31 is a schematic block diagram illustrating electronic devices including semiconductor memory devices according to example embodiments of the inventive concepts. Referring to FIG. 31, an electronic device 300 may, for example, be employed in a wireless communication device (e.g., PDA, a laptop computer, a portable computer, a web tablet, a wireless phone and/or a cell phone), and/or in electronic devices that can transmit and/or receive information in a wireless environment.

The electronic device 300 may include a controller 310, an input/output device 320 (e.g., a keypad, keyboard and/or a display), a memory 330, and a wireless interface 340 that are combined with one another through a bus 350. The controller 310 may include, for example, a microprocessor, digital signal processor, microcontroller and/or the like. The memory 330 may be used for storing an instruction code executed by the controller 310 and/or used for storing user data. The memory 330 may include a semiconductor memory device according to example embodiments of the inventive concepts described with reference to FIGS. 1-30.

The electronic device 300 may use a wireless interface 340 to transfer data to a wireless communication network that communicates by RF signal and/or to receive data from the wireless communication network that communicates by RF signal. For example, the wireless interface 340 may include an antenna, a wireless transceiver, and/or other wireless system elements. The electronic device 300 according to example embodiments of the inventive concepts may be used in a communication protocol, for example, a third generation communication system (e.g., CDMA, GSM, NADC, E-TDMA, WCDMA, and/or CDMA3000).

Figure 32:
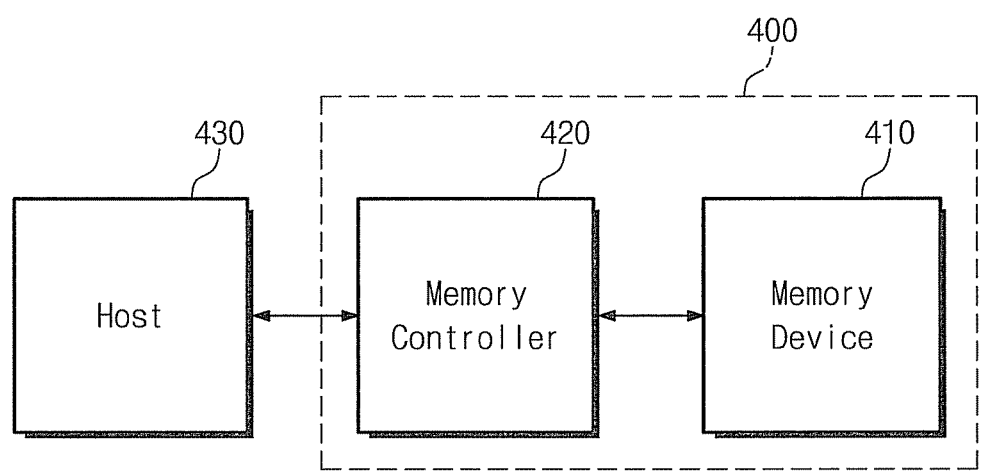

FIG. 32 is a schematic block diagram illustrating memory systems including semiconductor memory devices according to example embodiments of the inventive concepts. Referring to FIG. 32, a memory system 400 may include a memory device 410 for storing a relatively large amount of data and a memory controller 420. The memory controller 420 may control the memory device 410 in order to read and/or write data from/into the memory device 410 in response to a read/write request of a host 430. The memory controller 420 may include an address mapping table for mapping an address provided from the host 430 (e.g., mobile devices and/or computer systems) into a physical address of the memory device 410.

According to example embodiments of the inventive concepts, it may be possible to prevent and/or reduce a floating body phenomenon from occurring in a vertical channel transistor of a semiconductor device. According to example embodiments of the inventive concepts, it may be possible to suppress and/or reduce crosstalk between bit lines of a semiconductor device.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a plurality of semiconductor patterns on a substrate;
a plurality of first gate patterns between the semiconductor patterns;
a plurality of conductive line crossing the first gate patterns; and
a second gate pattern spaced apart from the first gate patterns by the semiconductor patterns, the second gate pattern including at least one first portion extending in parallel to the first gate patterns and at least one second portion extending in parallel to the conductive lines,
wherein the first gate patterns cross over the conductive lines, the at least one first portion of the second gate pattern is on top of the at least one second portion, and the at least one first portion of the second gate pattern crosses the at least one second portion.

2. The device of claim 1, further comprising:
a gate insulating layer between the at least one first portion and the semiconductor pattern and between the at least one second portion and the conductive line.

3. The device of claim 2, wherein the semiconductor pattern includes:
a first doped region of a first conductivity type, the first conductivity type different than a second conductivity type of the substrate,
a second doped region of the first conductivity type, and
a channel region between the first and second doped regions.

4. The device of claim 3, wherein the first portion penetrates the first doped region.

5. The device of claim 1, wherein the first portion is configured to face sidewalls of a plurality of the semiconductor patterns in common.

6. The device of claim 1, wherein the first portion further includes an extended portion extending toward the substrate on a sidewall of the second portion.

7. The device of claim 1, further comprising:
a first gate insulating layer between the first gate patterns and the semiconductor patterns.

8. The device of claim 1, further comprising:
a plurality of memory elements connected to the semiconductor patterns.

9. The device of claim 1, wherein, in a running direction of the conductive lines, the first portion is between the semiconductor patterns of a nearest pair and the first gate patterns are between the semiconductor patterns of a next nearest pair.

10. The device of claim 9, wherein the first gate patterns are spaced apart from each other between the semiconductor patterns of the next nearest pair.

11. The device of claim 1, wherein the second gate pattern is electrically isolated from the conductive lines.

12. The device of claim 1, wherein, in a running direction of the first gate pattern, the second gate pattern includes a plurality of the second portions between the semiconductor patterns constituting a nearest pair and between the semiconductor patterns constituting a next nearest pair, and the conductive lines are between the semiconductor patterns constituting the next nearest pair.

13. The device of claim 12, wherein:
the conductive lines are spaced apart from each other between the semiconductor patterns constituting the next nearest pair, and
in a space between the semiconductor patterns constituting the next nearest pair, the second portion is between the conductive lines.

14. The device of claim 1, further comprising:
a lower insulating layer between the second portion and the substrate and between the conductive lines and the substrate,
wherein the semiconductor patterns are electrically isolated from the substrate by the lower insulating layer.

15. The device of claim 1, further comprising:
a metal silicide layer,
wherein the semiconductor patterns are on the conductive lines, and
the metal silicide layer is between the semiconductor patterns and the conductive lines.

16. A vertical channel semiconductor device, comprising:
a plurality of active layers each including a channel between a source and a drain, the active layers arranged in rows and columns;
a plurality of first gates extending parallel to the rows of active layers;
a second gate, the second gate including first portions extending parallel to the rows of active layers and second portions extending parallel to the columns of active layers, each one of the first portions sandwiching a corresponding one of the rows of active layers with a corresponding one of the first portions; and
a plurality of conductive lines extending parallel to the columns of the active layers, the conductive lines being separated by the second portions of the second gate.

17. An electronic device, comprising:
a controller;
an input/output device;
a memory including the semiconductor device of claim 1;
a wireless interface; and
a bus connecting the controller, the input/output device, the memory and the wireless interface.

18. A memory system, comprising:
a memory controller;
a memory device including the vertical channel semiconductor device of claim 16; and
a host.

19. A semiconductor device, comprising:
a plurality of semiconductor patterns on a substrate;
a plurality of first gate patterns between the semiconductor patterns;
a plurality of conductive line crossing the first gate patterns; and
a second gate pattern spaced apart from the first gate patterns by the semiconductor patterns, the second gate pattern including at least one first portion extending in parallel to the first gate patterns and at least one second portion extending in parallel to the conductive lines, wherein
the semiconductor patterns are arranged in rows and columns, the semiconductor patterns are defined by first to fourth trenches in the substrate, the first and second trenches extend in a first direction parallel to each other and are alternatingly arranged in a second direction crossing the first direction, the third and fourth trenches extend in the second direction and are alternately arranged in the second direction, a bottom of the third trench is above bottoms of the first, second and fourth trenches, a width of the second trench is greater than a width of the first trench, each third trench includes two of the first gate patterns spaced apart from each other in the first direction between two corresponding rows of the semiconductor patterns, the at least one first portion and the at least one second portion are a plurality of first portions and a plurality of second portions of the second gate pattern, respectively, each one of the first portions of the second gate pattern is in a corresponding one of the fourth trenches between two adjacent rows of the semiconductor patterns, each of the first trenches includes one of the second portions of the second gate pattern between a corresponding two columns of the semiconductor patterns, each second trench includes one of the second portions of the second gate pattern extending between two of the conductive lines, and the first gate patterns cross over the second portions of the second gate pattern.

20. The device of claim 16, wherein the first gates cross over the second portions of the second gate, the first portions of the second gate pattern are on top of the second portions, and the first portions of the second gate pattern cross the second portions.

\* \* \* \* \*